(12) United States Patent
Sim et al.

(10) Patent No.: US 9,293,507 B2
(45) Date of Patent: Mar. 22, 2016

(54) ELECTRONIC DEVICE AND METHOD FOR FABRICATING THE SAME

(71) Applicant: SK hynix Inc., Icheon-Si (KR)

(72) Inventors: Joon-Seop Sim, Icheon-Si (KR); Seok-Pyo Song, Icheon-Si (KR); Jae-Yun Yi, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/322,814

(22) Filed: Jul. 2, 2014

(65) Prior Publication Data

US 2015/0049537 A1 Feb. 19, 2015

(30) Foreign Application Priority Data

Aug. 19, 2013 (KR) .................. 10-2013-0097674

(51) Int. Cl.
| | | |
|---|---|---|
| *G11C 11/00* | (2006.01) | |
| *H01L 27/24* | (2006.01) | |
| *G11C 11/16* | (2006.01) | |
| *G11C 5/14* | (2006.01) | |

(52) U.S. Cl.
CPC ........ *H01L 27/2463* (2013.01); *G11C 11/1697* (2013.01); *H01L 27/2436* (2013.01); *G11C 5/141* (2013.01)

(58) Field of Classification Search
CPC .................. H01L 27/10876; H01L 27/10829; H01L 27/10823; H01L 21/743; H01L 27/10861; H01L 27/1085; G11C 11/1697
USPC .......................... 365/148, 174, 158, 226, 227
See application file for complete search history.

(56) References Cited

U.S. PATENT DOCUMENTS

| | | | |
|---|---|---|---|
| 7,883,970 B2 | 2/2011 | Kim et al. | |
| 2009/0111232 A1* | 4/2009 | Kim et al. | ..................... 438/296 |
| 2013/0034957 A1* | 2/2013 | Miyata | ................ H01L 21/3212 438/637 |
| 2013/0070515 A1* | 3/2013 | Mayhew et al. | ............... 365/148 |
| 2014/0001525 A1* | 1/2014 | Kajiyama | ..................... 257/295 |

FOREIGN PATENT DOCUMENTS

KR 2010-0949901 B1 3/2010

* cited by examiner

*Primary Examiner* — Fernando Hidalgo
(74) *Attorney, Agent, or Firm* — Perkins Coie LLP

(57) ABSTRACT

An electronic device includes a semiconductor device that includes: a substrate including a switching element having a buried gate electrode; a buried decoupling capacitor having a line width same as a line width of the buried gate electrode; and a variable resistance element, electrically coupled to the switching element, formed over the substrate.

20 Claims, 23 Drawing Sheets

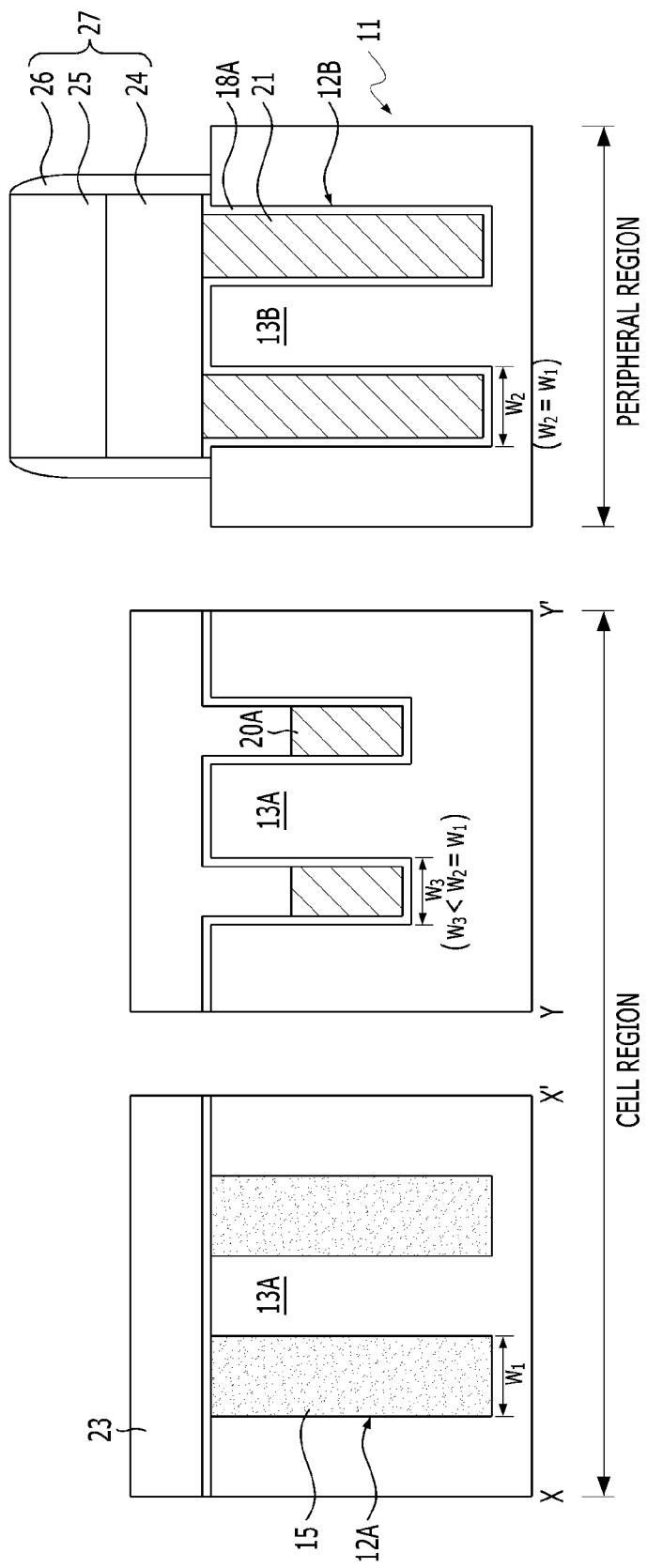

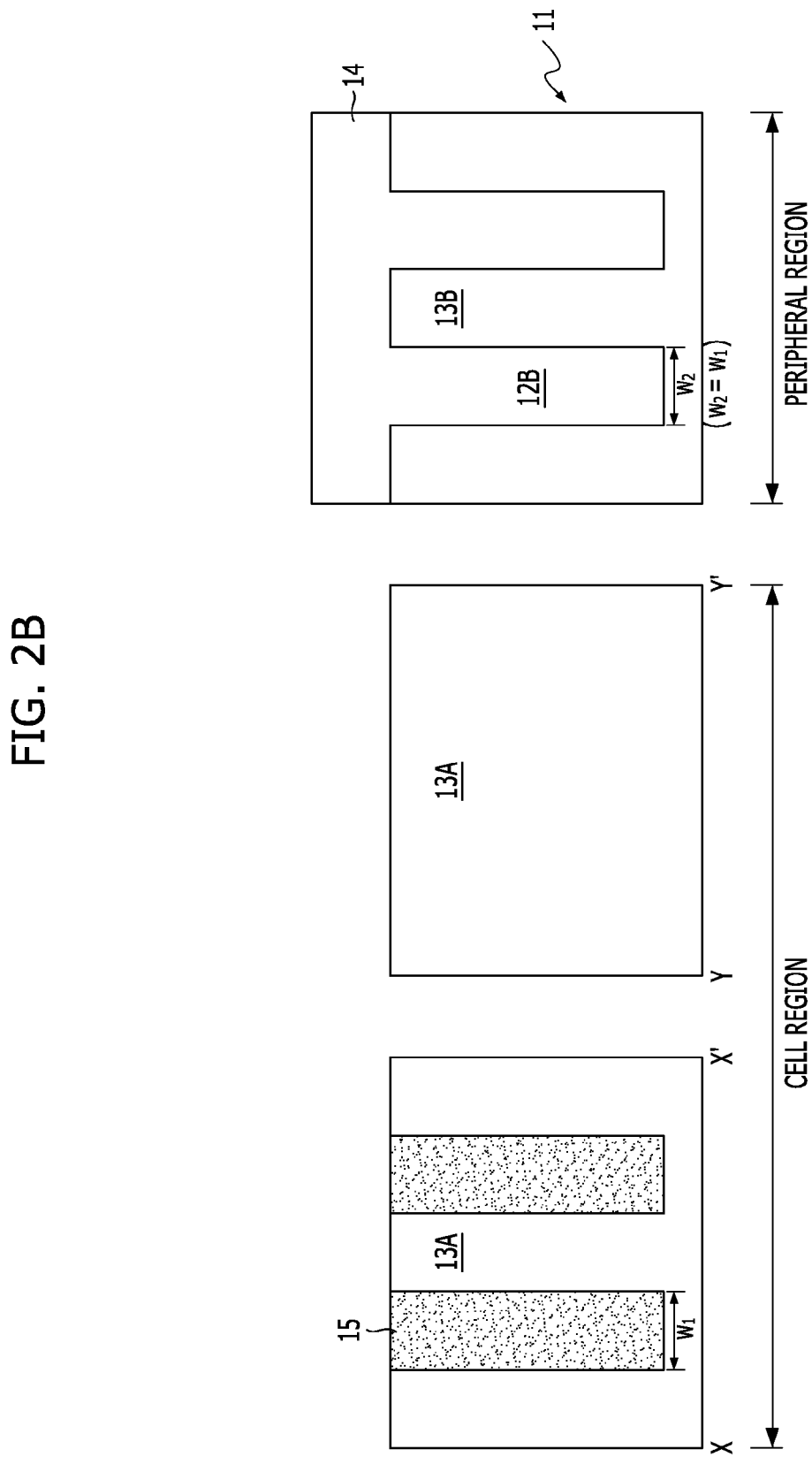

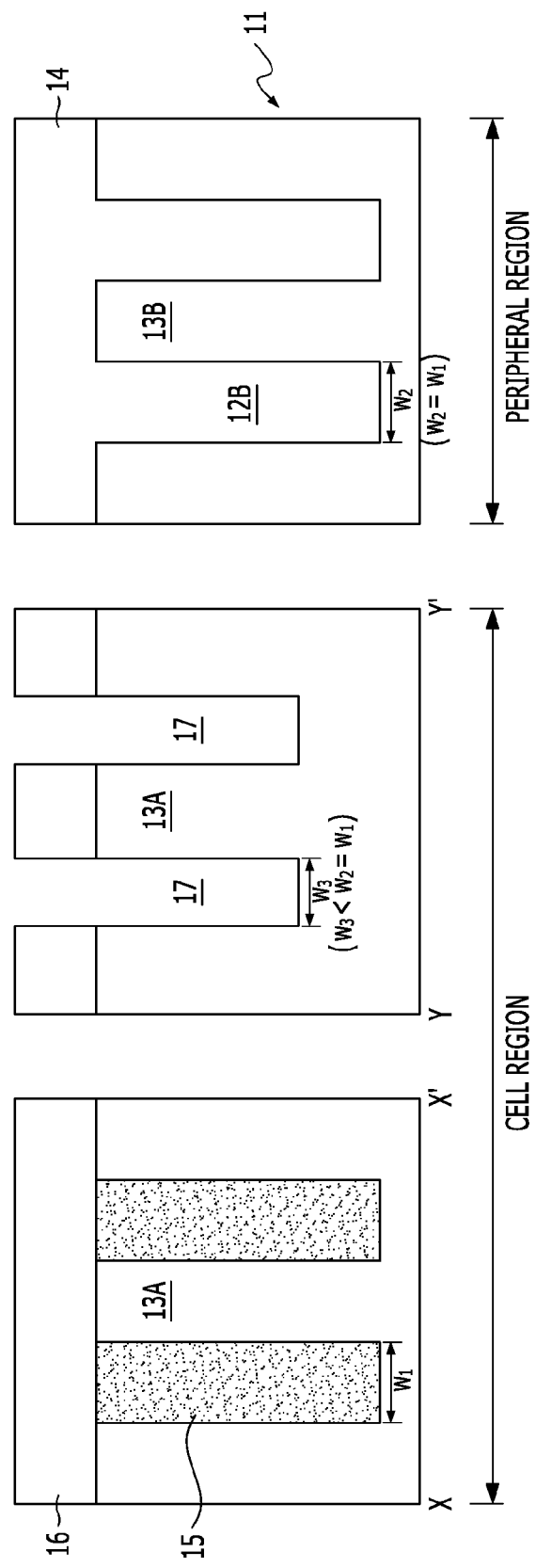

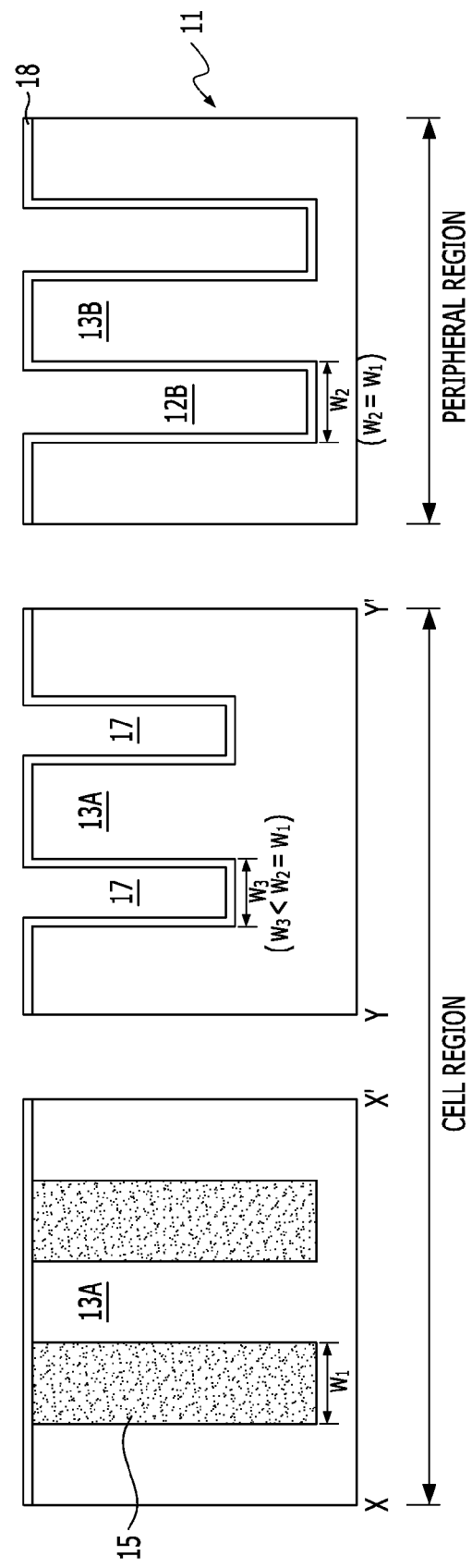

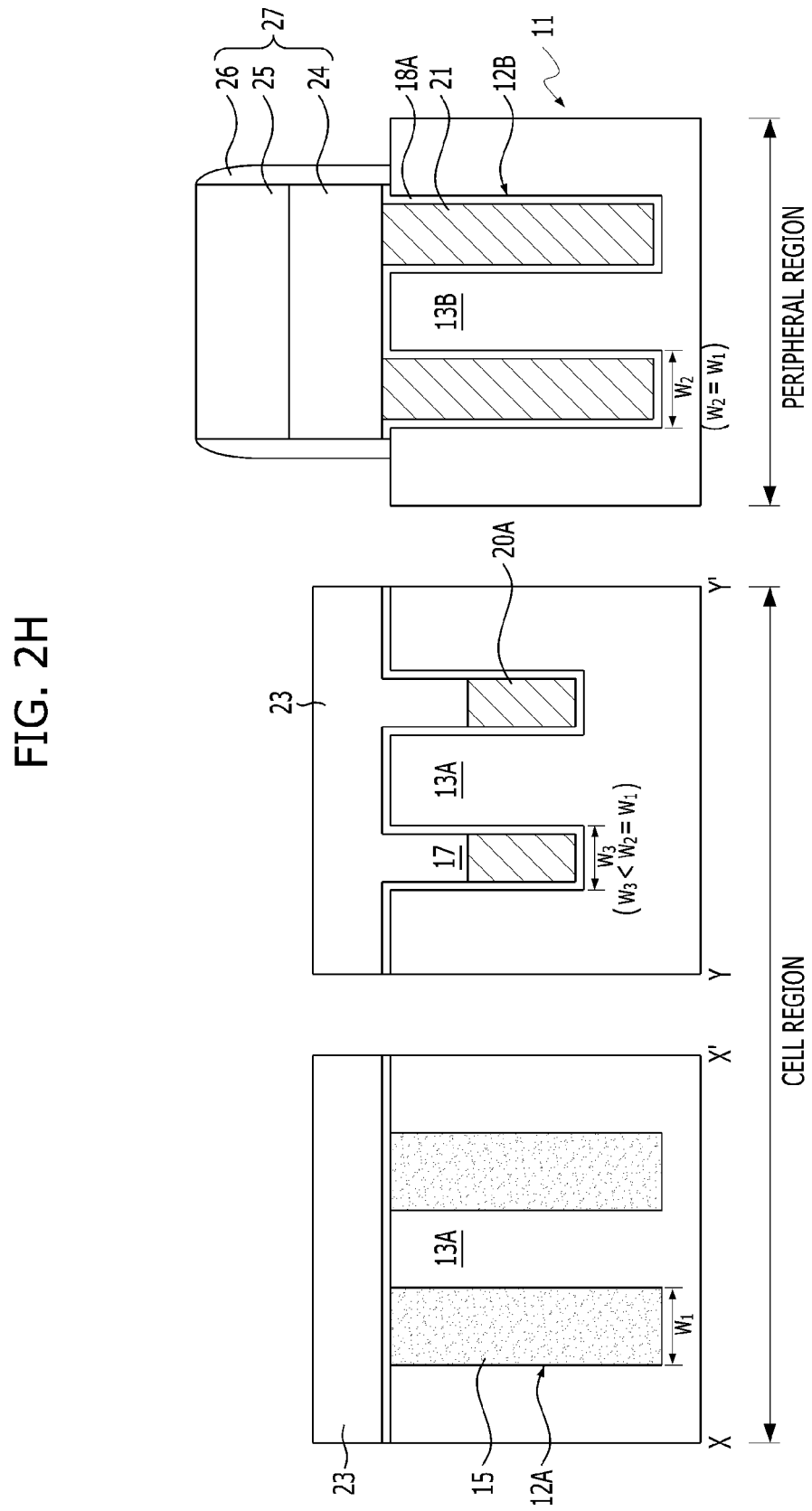

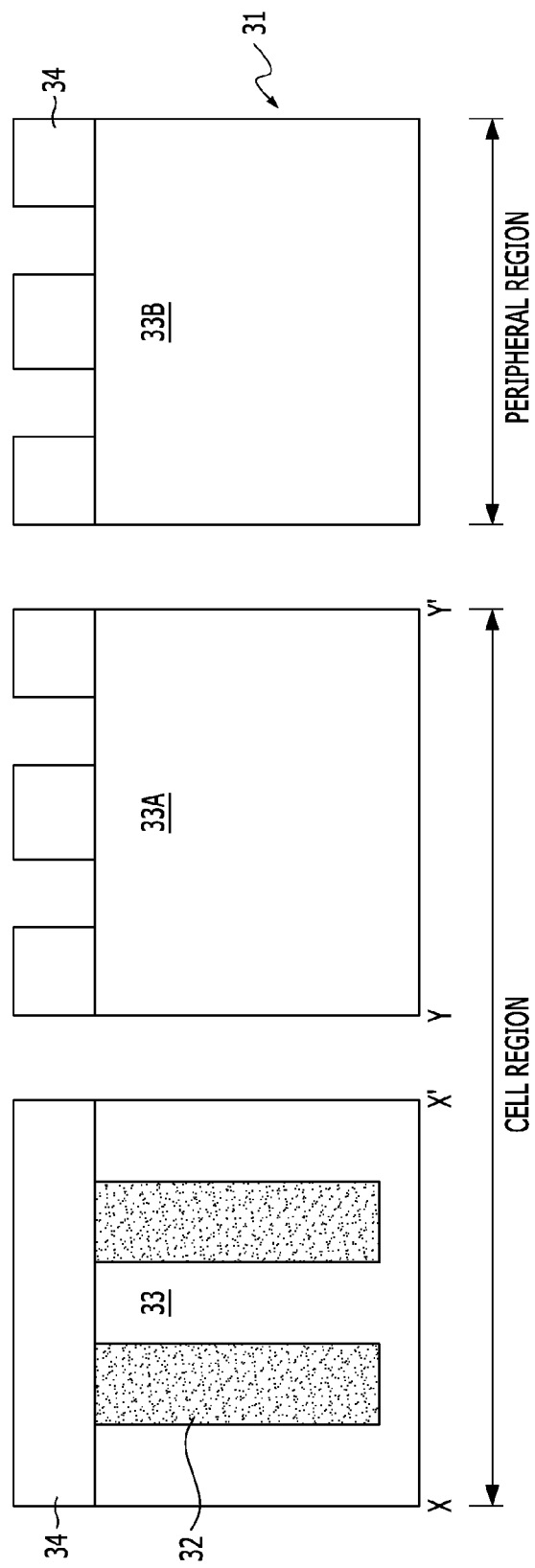

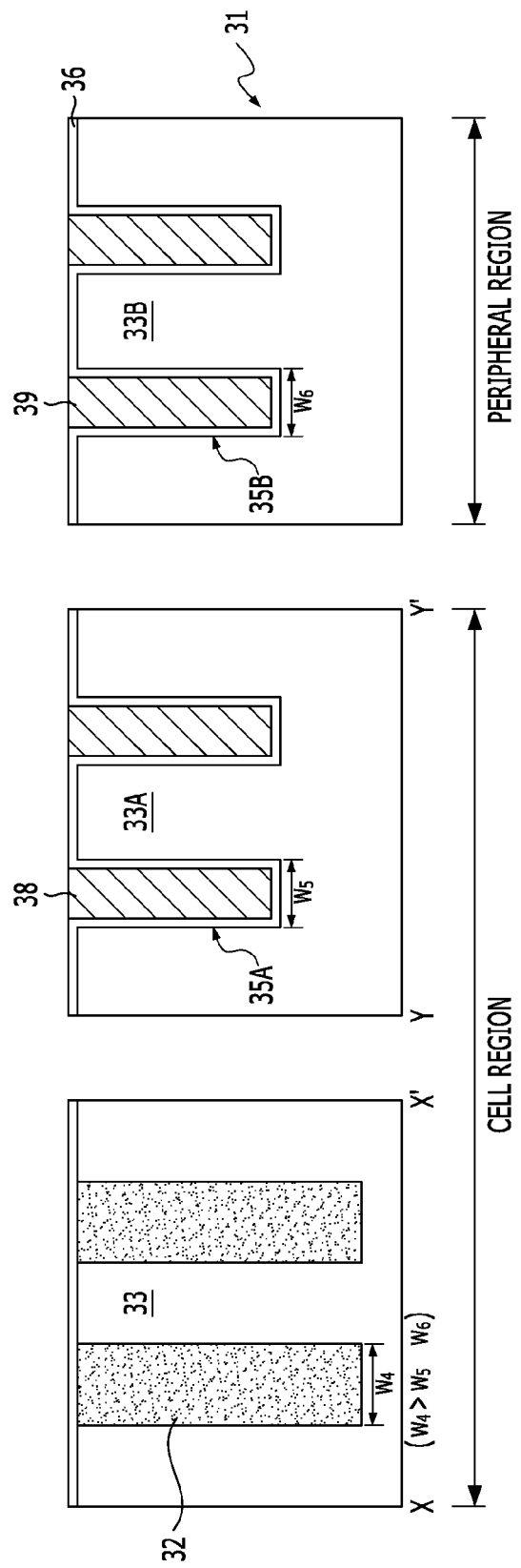

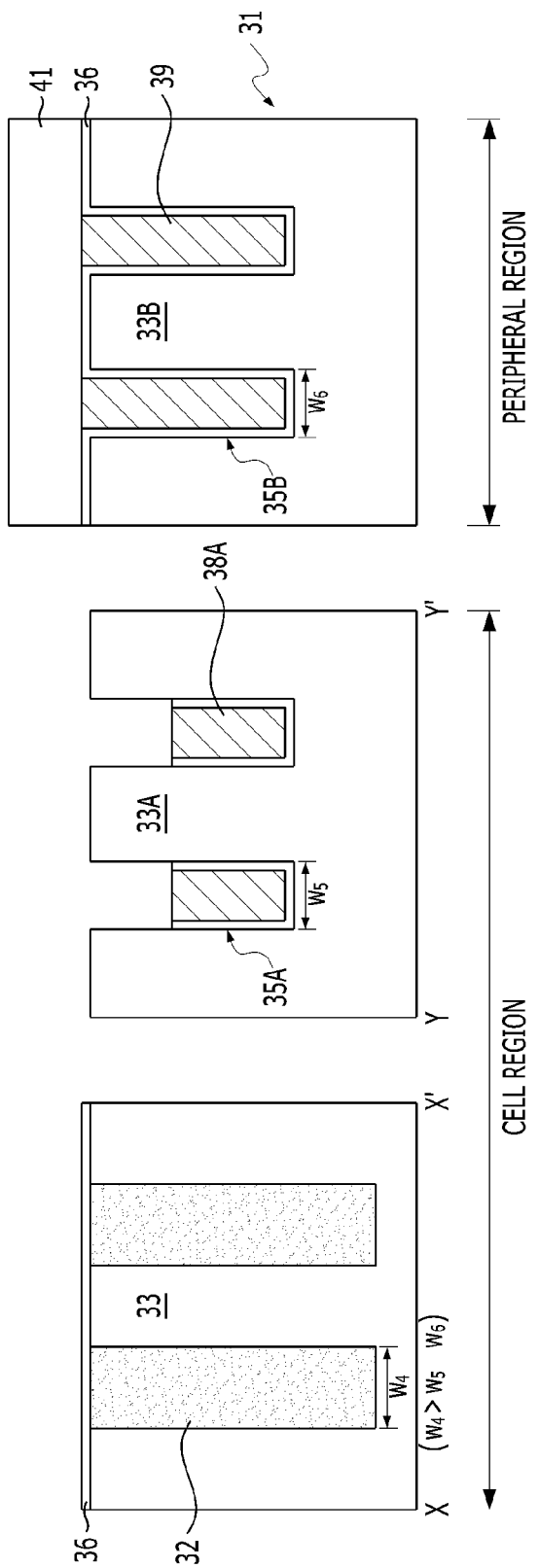

ELECTRONIC DEVICE AND METHOD FOR FABRICATING THE SAME

CROSS-REFERENCE TO RELATED APPLICATIONS

The present application claims priority of Korean Patent Application No. 10-2013-0097674, entitled "ELECTRONIC DEVICE AND METHOD FOR FABRICATING THE SAME" and filed on Aug. 19, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, and high performance, and so on, there is a demand for a semiconductor device capable of storing information in various electronic devices or appliances such as a computer, a portable communication device, and so on, and research and development for such semiconductor devices have been conducted. Examples of such a semiconductor device include a resistive random access memory (RRAM), a phase-change random access memory (PRAM), a ferroelectric random access memory (FRAM), a magnetic random access memory (MRAM) and an electric fuse (E-fuse).

SUMMARY

The disclosed technology in this patent document includes memory circuits or devices and their applications in electronic devices or systems and various implementations of an electronic device in which an improved patterning of a variable resistance element is provided to improve the characteristics of the variable resistance element. The disclosed implementations of electronic devices include one or more buried decoupling capacitors each having a portion of an electrode buried in a substrate and operable to stabilize a power supply for the electronic device.

In one aspect, an electronic device is provided to include a semiconductor memory unit that includes: a substrate including a switching element having a buried gate electrode, a buried decoupling capacitor having a line width same as a line width of the buried gate electrode, and a variable resistance element electrically coupled to the switching element and formed over the substrate.

In some implementations of the above aspect, the substrate may include a cell region and a peripheral region, and the buried decoupling capacitor is formed on the peripheral region. In some implementations, the buried decoupling capacitor may be formed in an outer region of the substrate. In some implementations of the above aspect, the buried decoupling capacitor may include a buried conductive pattern, which is buried in the substrate, and a conductive pattern, which is protruded to an upper portion of the substrate. In some implementations of the above aspect, the buried decoupling capacitor may be coupled to a plurality of buried conductive patterns, which are buried in the substrate, and includes a conductive pattern, which is protruded to an upper portion of the substrate.

In some implementations of the above aspect, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor. In some implementations of the above aspect, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor. In some implementations of the above aspect, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance element is part of the auxiliary memory device or the main memory device in the processing system. In some implementations of the above aspect, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system. In some implementations of the above aspect, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In another aspect, an electronic device is provided to include a semiconductor memory unit that includes: a substrate including an element isolation region and a switching element; and a decoupling capacitor, buried in the substrate, having a same line width as the element isolation region.

In some implementations of the above aspect, the substrate may include a cell region and a peripheral region, and the decoupling capacitor is formed in the peripheral region. In some implementations of the above aspect, the decoupling capacitor may be formed in an outer region of the substrate. In some implementations of the above aspect, the decoupling capacitor may include a buried conductive pattern, which is buried in the substrate, and a conductive pattern, which is protruded to an upper portion of the substrate. In some implementations of the above aspect, the decoupling capacitor may be coupled to a plurality of buried conductive patterns, which are buried in the substrate, and a conductive pattern, which is protruded to an upper portion of the substrate. In some implementations of the above aspect, the semiconductor memory unit may further include an insulation layer disposed between the substrate and the decoupling capacitor.

In some implementations of the above aspect, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor. In some implementations of the above aspect, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor. In some implementations of the above aspect, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance element is part of the auxiliary memory device or the main memory device in the processing system. In some implementations of the above aspect, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system. In some implementations of the above aspect, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In another aspect, a method is provided for fabricating an electronic device having a semiconductor memory unit. This method includes: forming a switching element having a buried gate electrode and a buried decoupling capacitor including a buried conductive pattern and a conductive pattern in a substrate, wherein the buried conductive pattern is buried in the substrate, and the conductive pattern is protruded to an upper portion of the substrate; and forming a variable resistance element, which is electrically coupled to the switching element, on the substrate. Another method is also provided for fabricating an electronic device having a semiconductor memory unit. This method may include: forming a buried gate electrode in a substrate to operate as a switching element; forming a buried decoupling capacitor including a buried conductive pattern to be buried in the substrate and a conductive pattern to protrude above the substrate; and forming a variable resistance element to be electrically coupled to the switching element.

In some implementations of the above aspect, the forming of the switching element and the buried decoupling capacitor may include: forming a first trench having a same line width in a first region and a second region of the substrate; forming an element isolation region, which defines an active region, by burying the first trench of the first region; forming a second trench in the first region by selectively etching the active region; forming a conductive material, which is buried in the second trench of the first region and the first trench of the second region; forming a buried gate electrode of the first region and a buried conductive pattern of the second region by etching the conductive material; and forming the decoupling capacitor in the buried conductive pattern of the second region. In some implementations of the above aspect, the forming of the buried gate electrode in the substrate may include: forming a first trench having a line width $W_1$ in a first region of the substrate; forming an element isolation region, which defines an active region, by burying the first trench of the first region; forming a second trench having a line width in the first region by selectively etching the active region; forming a conductive material, which is buried in the second trench of the first region; forming the buried gate electrode of the first region by etching the conductive material. In some implementations, the forming of the buried decoupling capacitor may include: forming a first trench having the line width $W_1$ or the line width $W_2$ in a second region of the substrate; forming a conductive material to be buried in the first trench of the second region; etching the conductive material to form the buried conductive pattern of the second region; and forming the conductive pattern connected to the buried conductive pattern of the second region.

In some implementations of the above aspect, the method may further include: forming a first mask pattern covering the first trench of the second region before the forming of the element isolation region. In some implementations of the above aspect, the method may further include: forming an insulation layer on an entire surface of the substrate including the second trench of the first region and the first trench of the second region before the forming of the conductive material. In some implementations of the above aspect, the forming of the buried gate electrode of the first region may include: etching the conductive material to form the buried conductive pattern in the first region and the second region; forming a second mask pattern which exposes the buried conductive pattern of the first region; and forming the buried gate electrode by recessing the buried conductive pattern of the first region. In some implementations of the above aspect, the buried conductive pattern of the second region and the decoupling capacitor may establish the buried decoupling capacitor. In some implementations of the above aspect, the buried conductive pattern of the second region and the conductive pattern may operate as an upper electrode of the buried decoupling capacitor.

In some implementations of the above aspect, the buried decoupling capacitor may include a structure that a plurality of buried conductive patterns are coupled to the decoupling capacitor. In some implementations of the above aspect, the buried conductive pattern of the second region and the conductive pattern operate as an upper electrode of the buried decoupling capacitor.

In some implementations of the above aspect, the forming of the switching element and the buried decoupling capacitor may include: forming an element isolation region, which defines an active region in the substrate having a first region and a second region; forming a first trench having a same line width in the first region and the second region; forming a buried gate electrode, which is partially buried in the first trench of the first region; and burying the first trench of the second region and forming the buried decoupling capacitor, which is protruded to an upper portion of the substrate. In some implementations of the above aspect, the forming of the buried gate electrode may include: forming a conductive material, which is buried in the first trenches of the first region and the second region; forming the buried conductive pattern in the first region and the second region by etching the conductive material; forming a second mask pattern in the second region to open the buried conductive pattern of the first region; and forming the buried gate electrode by recessing the buried conductive pattern of the first region. In some implementations of the above aspect, the method may further include: forming an insulation layer on an entire surface of the substrate including the first trench before the forming of the conductive material. In some implementations of the above aspect, the forming of the buried decoupling capacitor may further include: forming a conductive pattern where a metal-containing layer and a hard mask layer are stacked on the substrate including the buried conductive pattern of the second region. In some implementations of the above aspect, the buried decoupling capacitor may include a structure that a plurality of buried conductive patterns are coupled to the conductive pattern.

In another aspect, a method is provided for fabricating an electronic device having a semiconductor memory unit. This method may include: applying a first mask to form an element isolation region having a line width $W_1$; applying a second mask to form a buried gate electrode having a line width $W_2$; and applying the first mask or the second mask to form a buried decoupling capacitor including a buried conductive pattern having a line width $W_3$ which is the same as either the line width $W_1$ or the line width $W_2$.

In some implementations of the above aspect, if the first mask is applied to form the buried decoupling capacitor, a mask process and an etching process for forming the buried conductive pattern may be simultaneously process at the same time with a mask process and an etching process for forming the element isolation region.

In some implementations of the above aspect, if the second mask is applied to form the buried decoupling capacitor, a mask process and an etching process for forming the buried conductive pattern may be simultaneously process at the same time with a mask process and an etching process for forming the buried gate electrode.

In another aspect, an electronic device is provided to include a semiconductor memory unit that includes: a substrate including active regions defined by an element isolation region having a line width $W_1$; a buried gate electrode operable as a switching element and having a line width $W_2$ different from $W_1$; a buried decoupling capacitor including a buried conductive pattern having a line width $W_3$ same as the line with $W_1$ or the line width $W_2$ and a conductive pattern coupled to the buried conductive pattern; and a variable resistance element electrically coupled to the switching element and formed over the substrate.

In some implementations of the above aspect, the substrate may include a cell region and a peripheral region, and the buried decoupling capacitor is formed on the peripheral region. In some implementations of the above aspect, the buried decoupling capacitor may be formed in an outer region of the substrate. In some implementations of the above aspect, the buried conductive pattern may be buried in the substrate, and the conductive pattern protrudes above the substrate.

The semiconductor memory unit may further include: an insulation layer disposed between the substrate and the buried decoupling capacitor.

In another aspect, an electronic device is provided to include a semiconductor memory unit that includes a substrate including an element isolation region in the substrate and a switching element; and a decoupling capacitor, including a capacitor electrode that includes an electrode portion buried in the substrate and, having a line width which is the same as a line width of the element isolation region. The decoupling capacitor is coupled to stabilize a power supply for the electronic device.

In yet another aspect, an electronic device is provided to include a semiconductor memory unit that includes: a substrate including active regions defined by an element isolation region having a line width $W_1$; a buried gate electrode that is buried in the substrate and is operable as a switching element and has a line width $W_2$ different from $W_1$; a buried decoupling capacitor including (1) a buried conductive pattern that includes a portion buried in the substrate and has a line width $W_3$ which is the same as the line with $W_1$ or the line width $W_2$ and (2) a conductive pattern coupled to the buried conductive pattern, the decoupling capacitor being coupled and operable to stabilize a power supply for the electronic device; and a variable resistance element electrically coupled to the switching element and formed over the substrate.

The above and other aspects and their implementations are described in greater detail in the drawings, the description and the claims.

BRIEF DESCRIPTION OF THE DRAWINGS

FIG. 1 is an exemplary cross-sectional view of an electronic device including a decoupling capacitor in accordance with an implementation of the disclosed technology in this patent document.

FIGS. 2A to 2H are cross-sectional views explaining a method for fabricating an electronic device shown in FIG. 1.

FIGS. 4A to 4E are cross-sectional views explaining a method for fabricating an electronic device shown in FIG. 3.

DETAILED DESCRIPTION

Figure 2A:
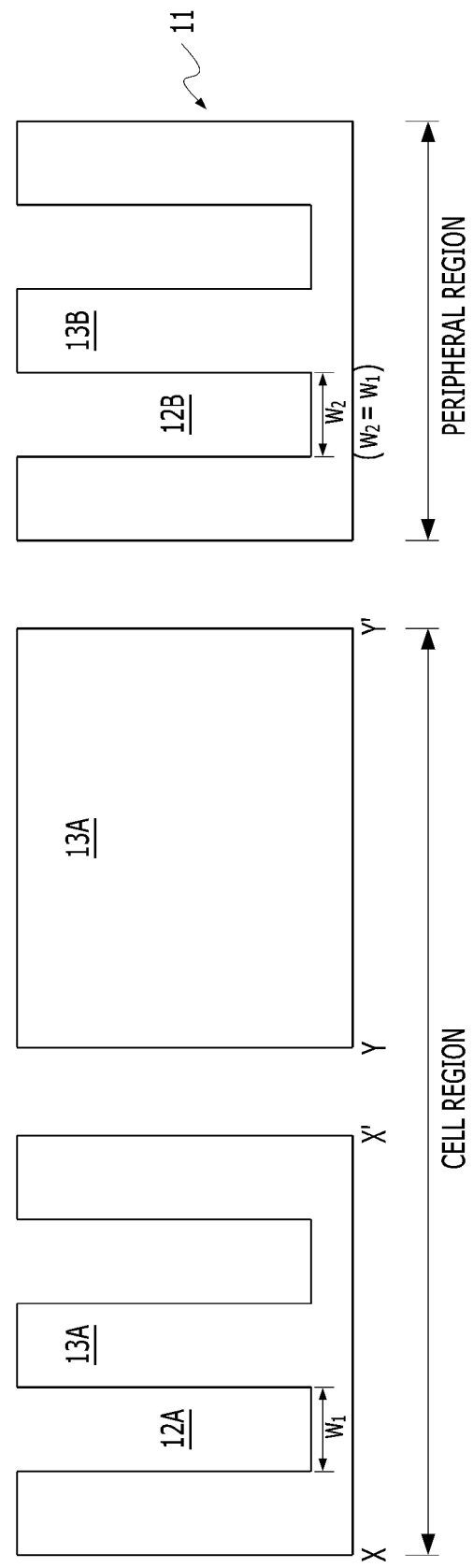

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is an exemplary cross-sectional view illustrating an electronic device including a decoupling capacitor in accordance with an implementation of the disclosed technology in this patent document.

As shown in FIG. 1, an element isolation region 15 is in a substrate 11 having a first region and a second region. First and second active regions 13A and 13B are defined by the element isolation region 15. A buried gate electrode 20A is formed in the first active region 13A of the first region. A sealing layer 23 is formed on the buried gate electrode 20A. The first region may indicate a cell region and the second region may indicate a peripheral region.

Buried conductive patterns 21 having a line width $W_2$ as same as a line width $W_1$ of the element isolation region 15 of the first region is formed in the second region. A conductive pattern 27 is formed on the buried conductive patterns 24. An insulation layer 18A is formed between the buried conductive patterns 21 and the substrate 11. A buried decoupling capacitor may be provided using the buried conductive patterns 21 and the conductive pattern 27 as part of the electrodes for the capacitor.

The buried conductive patterns 21 of the second region is formed with the same line width as that of the element isolation region 15 of the first region. Since more buried conductive patterns 21 may be formed in the same region, a capacitance of the decoupling capacitor may increase with the number of the buried conductive patterns 21. Especially, the buried conductive patterns 21 may be patterned using a mask used for forming the element isolation region 15. A spacer pattern technology (SPT) process or a double pattern technology (DTP) process can be used, which provides a trench with a line width to overcome an exposure limitation, thereby maximizing an area of a capacitor.

Although two buried conductive patterns are formed in the second region in the present implementation, other implementations are also possible. For example, the number of buried conductive patterns may increase to increase the capacitance value or decrease to reduce the capacitance value according to a capacitance required. Thus, a plurality of buried conductive patterns may be included in a decoupling capacitor according to the capacitance required.

Although the decoupling capacitor is formed in the second region in the present implementation, other implementations are also possible. For example, a decoupling capacitor can be formed in the first region; and a decoupling capacitor for stabilizing a power supply may be additionally formed in the outer space of the cell region.

A variable resistance element is formed on an upper portion of the substrate of the first region, which will be explained in details later.

FIGS. 2A to 2H are cross-sectional views showing a method for fabricating an electronic device shown in FIG. 1. For the convenience of the descriptions, the same reference numerals as used in FIG. 1 are used to indicate the same elements. A cell region and a peripheral region are indicated in the drawings. The drawings show cross-sectional views of a cell region, which are taken along a short axis direction X-X' and a long axis direction Y-Y'. The drawings show a cross-sectional view of a peripheral region in which a decoupling capacitor is formed.

As shown in FIG. 2A, first trenches 12A and 12B are formed in a substrate 11 having a first region and a second region, respectively. The substrate 11 may include a semiconductor substrate. The substrate 11 may include a silicon substrate, a silicon-germanium substrate, or a silicon-on-insulator (SOI) substrate. The first region may indicate a cell region and the second region may indicate a peripheral region.

The first trench 12A of the first region forms an element isolation region. The first trench 12B of the second region forms a decoupling capacitor. In the second region, a trench for an element isolation region may be formed in addition to the first trench 12B. The trench for the element isolation region in the second region may have a line width deeper and wider than the trench of the first region. The first trench 12B of the second region may have a line width $W_2$ as same as a line width $W_1$ of the first trench of the first region.

An active region 13A of the first region is defined by the first trench 12A of the first region. An active region 13B of the second region is defined by the first trench 12B of the second region. The first trench 12B of the second region may be separate from the trench for the element isolation region which is not shown, and may be an active region defined by the trench for the element isolation region.

As shown in FIG. 2B, a first mask pattern 14 is formed in the second region to protect the second region during the formation of the element isolation region in the first region. The first mask pattern 14 is formed on an upper portion of the decoupling capacitor. The element isolation regions of the first region and the second region may be simultaneously formed. The first mask pattern 14 may be formed to have a thickness sufficient to protect the second region, and may be formed of materials that can be easily removed.

Subsequently, the element isolation region 15 is formed in the first trench 12A of the first region. A wall oxide, a liner, a gap-filling nitride and silicon oxide may be sequentially formed in the element isolation region 15 of the first region. The liner may include a silicon nitride and a silicon oxide. The silicon nitride may include $Si_3N_4$. The silicon oxide may include $SiO_2$. The gap-filling material may include a silicon oxide such as a spin-on-dielectric (SOD). The gap-filling material may include a silicon nitride. Herein, the gap-filling material may include the silicon nitride used in the liner.

As shown in FIG. 2C, a second mask pattern 16 is formed over the substrate 11 of the first region. A buried gate region is defined by the second mask pattern 16. The second mask pattern 16 may be patterned with a line type expanding along a short axis of the active region.

Subsequently, a second trench 17 is formed by etching the active region using the second mask pattern 16 as an etch-barrier. The second trench 17 provides a buried gate region. A line width $W_3$ of the second trench 17 may be narrower than line widths $W_1$ and $W_2$ of the first trenches 12A and 12B. A depth of the second trench 17 is less than depths of the first trenches 12A and 12B.

As shown in FIG. 2D, the second mask pattern 16 and the first mask pattern 14 are removed.

Subsequently, an insulation layer 18 is formed on the entire surface of the substrate 11 having the second trench 17 of the first region and the first trench 12B of the second region. The insulation layer 18 may function as a gate insulation layer between the substrate 11 and a buried gate which is formed later, and as a dielectric layer of a decoupling capacitor which is formed later. The insulation layer 18 may include a silicon oxide, a silicon nitride, a tantalum oxide, a hafnium oxide, an aluminum oxide, a zirconium oxide or a combination thereof. The insulation layer 18 may be formed through an oxidation process, a chemical vapor deposition (CVD) process, a physical vapor deposition (PVD) process, or an atomic layer deposition (ALD) process.

Figure 2E:
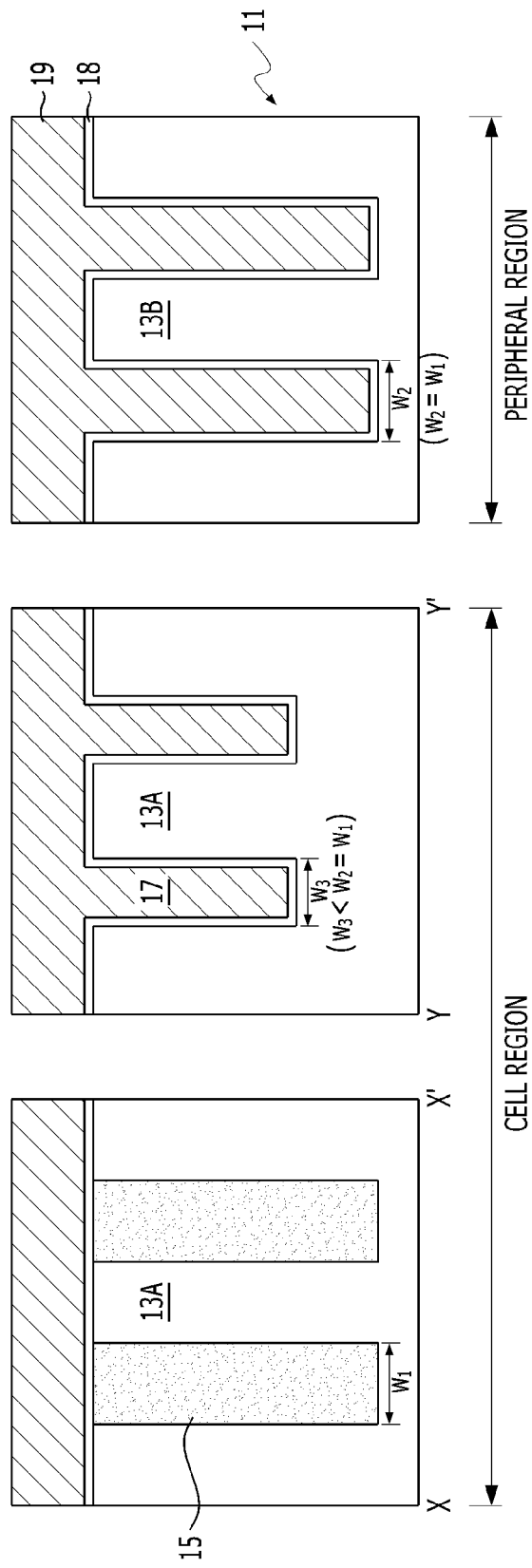

As shown in FIG. 2E, a conductive material 19 is formed on the insulation layer 18 to bury the first trench 12B of the second region and the second trench 17 of the first region. The conductive material may include a semiconductor layer or a metal-containing layer. The semiconductor layer may include a silicon layer. The silicon layer may include a poly-silicon layer. The metal-containing layer may include a material having a metal such as a titanium (Ti), a tantalum (Ta) or a tungsten (W). The metal-containing layer may include at least one selected from a group of a tantalum nitride (TaN), a titanium nitride (TiN), a tungsten nitride (WN) and a tungsten (W). For example, the conductive material 19 may include the tantalum nitride (TaN), the titanium nitride (TiN) or the tungsten (W), or may include a stacked structure having TiN and W or TaN and W, where the tungsten (W) is stacked on the titanium nitride (TiN) or the tantalum nitride (TaN). The conductive material 19 may include a stacked structure having WN and W, where the tungsten (W) is stacked on the tungsten nitride (WN), and may include a metal material having a low resistance.

Figure 2F:
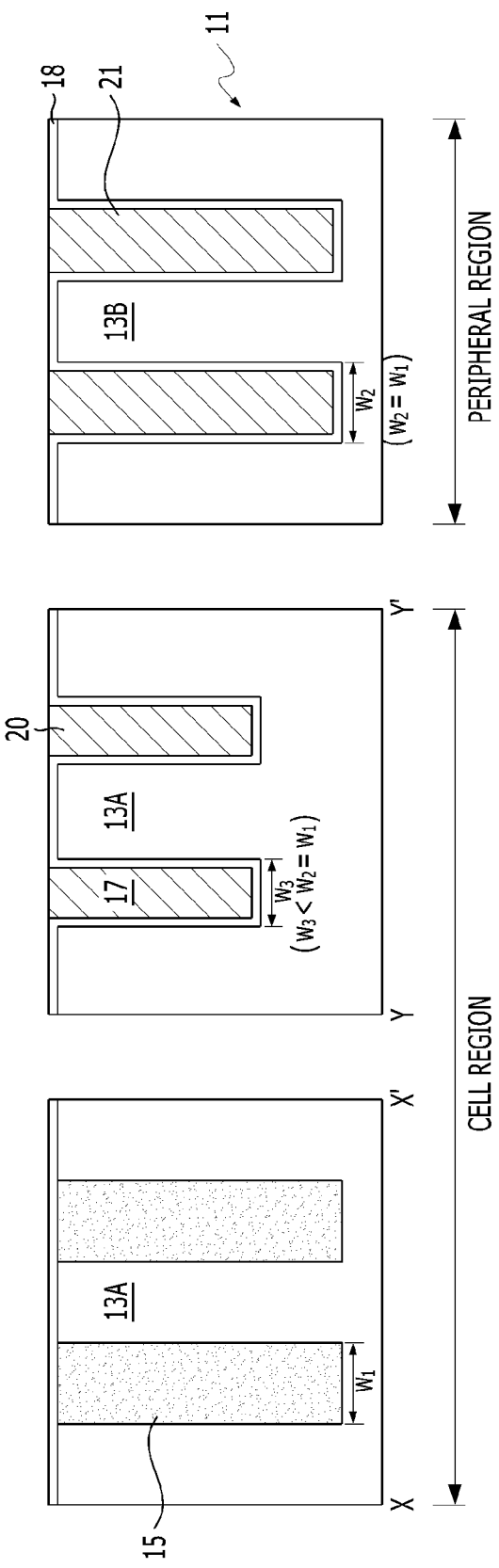

As shown in FIG. 2F, the conductive material 19 is etched such that the insulation layer 18 is exposed through a planarization process. The planarization process may includes an etch back process or a chemical mechanical polishing (CMP) process.

Thus, a first buried conductive pattern 20 and a second buried conductive pattern 21 remain in the second trench 17 of the first region and the first trench 12B of the second region, respectively.

Figure 2G:
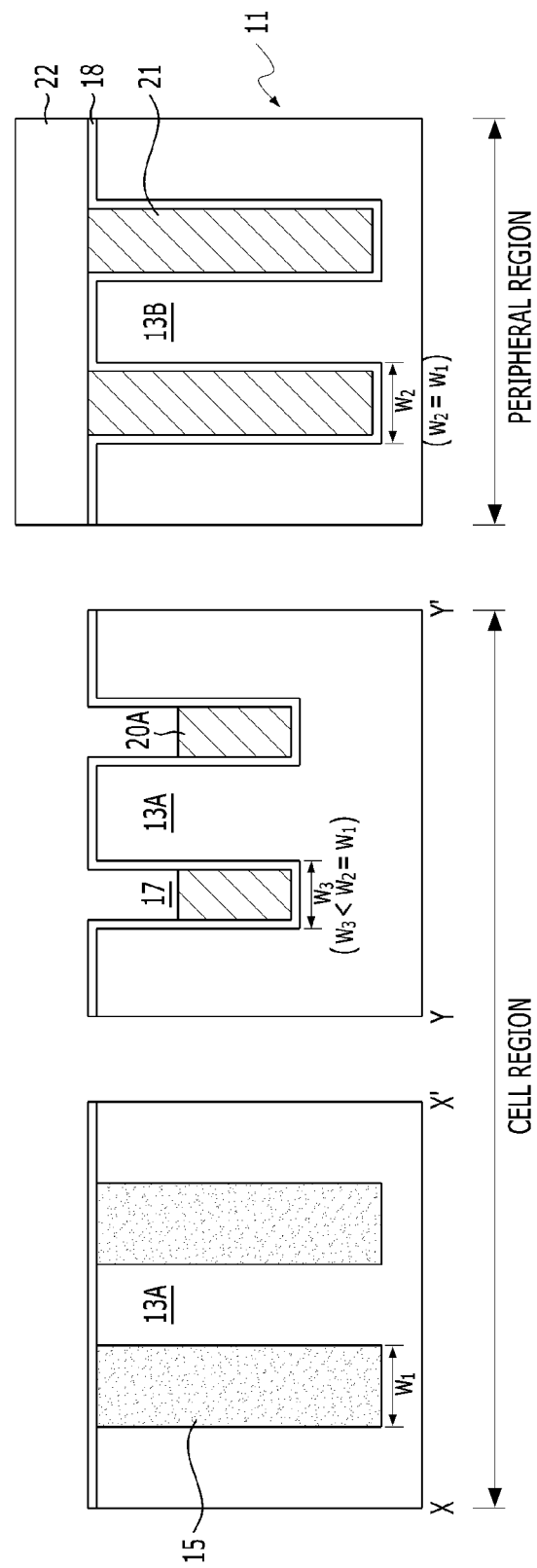

As shown in FIG. 2G, a third mask pattern 22 is formed on the remaining region except the first buried conductive pattern 20 of the first region. The third mask pattern 22 prevents the second buried conductive pattern 21 of the second region from being removed when the conductive pattern 20 of the first region is etched.

Subsequently, a buried gate electrode 20A, which is partially buried in the second trench 17, is formed by recessing the first buried conductive pattern 20 of the first region. The buried gate electrode 20A may be operated as a switching element of a semiconductor device for selecting at least one of a plurality of memory cells in a semiconductor device.

As shown in FIG. 2H, a sealing layer 23 is formed on the buried gate electrode 20A. The sealing layer 23 may gap-fill the second trench 17. The sealing layer 23 may protect the buried gate electrode 20A during subsequent processes. The sealing layer 23 may include an insulation material. The sealing layer 23 may include a silicon nitride, and may be planarized.

Subsequently, the third mask pattern 22 is removed. In another embodiment, the third mask pattern 22 may be removed before the sealing layer 23 is formed.

A conductive pattern 27 is formed to be coupled to the second buried conductive patter 21 of the second region. The conductive pattern 27 may include a stack structure of a metal-containing layer 24 and a hard mask layer 25. The spacer 26 may be formed on the sidewall of the conductive pattern 27. The metal-containing layer 24 may include a stack structure of a barrier metal layer and a metal layer. The metal-containing layer 24 may include the same material as the second buried conductive pattern 21. The hard mask layer 25 is used as an etch-barrier and protection of the metal-containing layer 24. The hard mask layer 25 may include an insulation material, e.g., a silicon nitride. The spacer 26 protects a sidewall of the conductive pattern 27, and may include an insulation material. The conductive pattern 27 may be formed by patterning a plurality of second buried conductive patterns 21, the metal-containing layer 24 and the hard mask layer 25, which are stacked. The insulation layer 18A may be etched when the conductive pattern 27 is patterned.

The conductive pattern 27 may be formed when a gate process is performed in the second region except a decoupling capacitor region. The conductive pattern 27 is coupled to the second buried conductive pattern 21 to form a part of a buried decoupling capacitor. That is, the buried decoupling capacitor may use the substrate 11 as one of the two electrodes for the buried decoupling capacitor (i.e., a lower electrode), the insulation layer 18A as a dielectric layer between the two electrodes of the buried decoupling capacitor, and the combined structure of the conductive pattern 27 coupled to the second buried conductive pattern 21 as the other of the two electrodes for the buried decoupling capacitor (i.e., an upper electrode). In this design, the combined structure of the conductive pattern 27 and the second buried conductive pattern 21 as the upper electrode of the buried decoupling capacitor has an electrode portion that protrudes above the first trench 12B of the second region of the substrate 11 and thus protrudes above the upper portion of the substrate 11.

As described above, the mask process for forming a decoupling capacitor is not separately or additionally performed. Rather, the mask process for forming a decoupling capacitor is performed at the same time with forming the element isolation region in the first region by performing a simultaneous etching using the same mask. Thus, an additional etching or mask process can be omitted, thereby enabling high-productivity fabrication of the semiconductor device, simplified fabrication of the semiconductor device, and providing a sufficient margin.

A capacitance of a capacitor may increase by forming a plurality of trenches with a line width as same as a line width $W_1$ of the first trench 12A used for forming the element isolation region in the first region.

If a fine pattern process such as a spacer pattern technology (SPT) or a double pattern technology (DPT) is used in forming the active region 13A of the first region, a trench can be formed to have a line width sufficient to overcome an exposure limitation. Thus, an area can be maximized and a capacitance of the capacitor may increase.

Although two second buried conductive patterns are shown in the second region in the present implementation, the number of second buried conductive patterns may increase or decrease according to a required capacitance. That is, a single decoupling capacitor may include a plurality of buried conductive patterns according to a required capacitance. The number of the buried conductive patterns can be increased to increase the capacitance value.

The above described example of a buried decoupling capacitor is coupled to circuitry and is operable to stabilize a power supply for the circuitry. This effect of stabilizing the power supply improves the operation or performance of the device.

Although the decoupling capacitor is formed in the second region in the above described implementation, a decoupling capacitor may also be formed in the first region to provide a stable power supply. That is, an additional decoupling capacitor may be formed in a peripheral region of a cell region or between cell elements to stabilize a power supply. Such a decoupling capacitor in the first region, like the above described decoupling capacitor in the second region, includes an upper electrode that has a portion protruding above the upper portion of the substrate.

A variable resistance element is formed on an upper portion of the substrate of a cell region as will be explained later.

Figure 3:
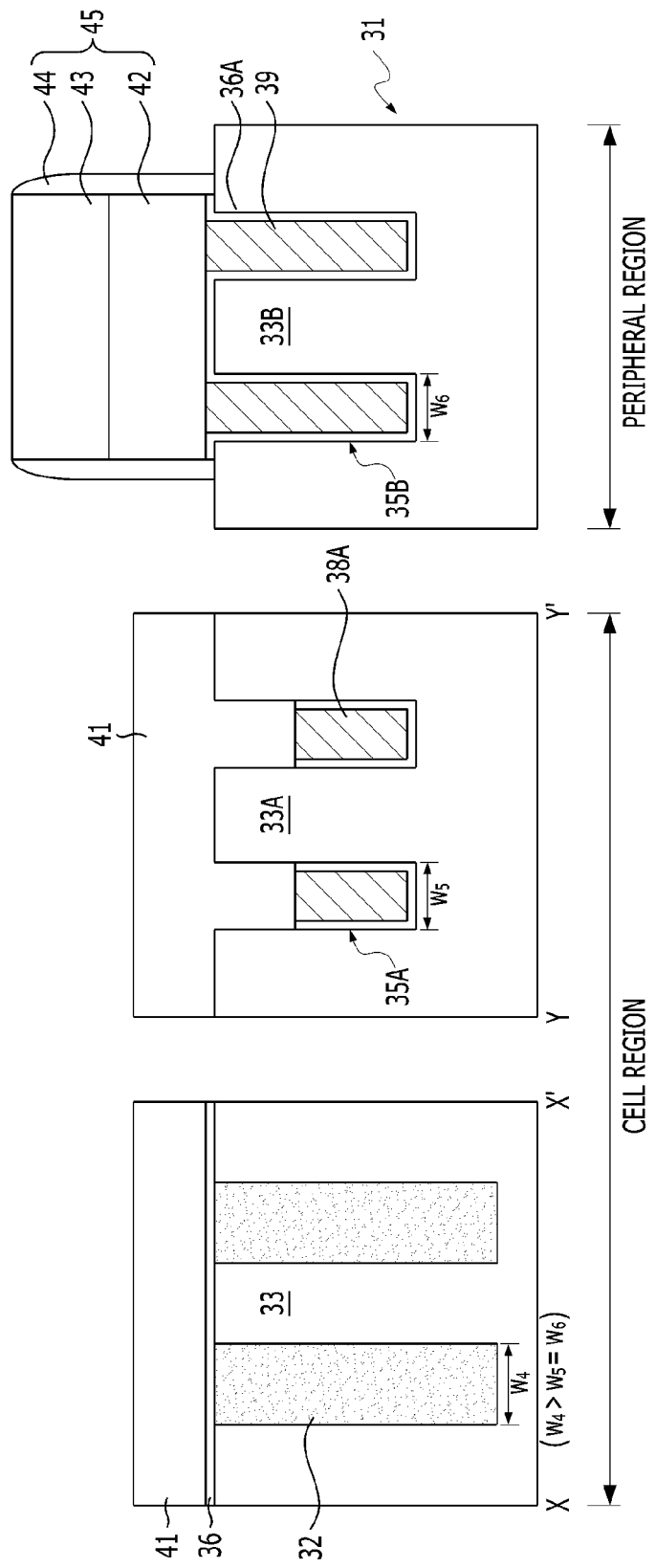
FIG. 3 is an exemplary cross-sectional view of an electronic device including a decoupling capacitor in accordance with an implementation of the disclosed technology in this patent document.

FIG. 3 is an exemplary cross-sectional view of an electronic device including a decoupling capacitor.

As shown in FIG. 3, element isolation regions 32 are formed in a substrate 31 including a first region and a second region. First and second active regions 33A and 33B are defined by the element isolation regions 32. A buried gate electrode 38A is formed in the first active region 33A. A sealing layer 41 is formed on the buried gate electrode 38A. The first region and the second region correspond to a cell region and a peripheral region, respectively.

In the second region, a buried conductive pattern 39 is formed to having a line width $W_6$ as same as the line width $W_4$ of the element isolation region 32 of the first region. A conductive pattern 45 is formed on the buried conductive pattern 39. An insulation layer 36A is formed between the buried conductive pattern 39 and the substrate 31. The buried conductive pattern 39 and the conductive pattern 45 may be used to form the upper electrode of a buried decoupling capacitor that includes the insulation layer 36A as the dielectric layer between two electrodes and the substrate 31 as the lower electrode of the buried decoupling capacitor.

The buried conductive pattern 39 of the second region has the same line width as that of the element isolation region 32 of the first region. Since more buried conductive patterns 39 can be formed in same region, a capacitance of the decoupling capacitor may increase. Especially, the buried conductive pattern 39 may be patterned using a mask used in forming the element isolation region 15.

If a spacer pattern technology (SPT) or a double pattern technology (DPT) is used during the mask process, a trench can be formed to have a line width sufficient to overcome an exposure limitation. Thus, an area for a capacitor may be maximized.

Although two second buried conductive patterns are shown in the second region in the present implementation, the number of second buried conductive patterns may increase or decrease according to a required capacitance. That is, a single decoupling capacitor may include a plurality of buried conductive patterns according to a required capacitance and the number of the buried conductive patterns increases with the value of the required capacitance.

Although the decoupling capacitor is formed in the second region in the present implementation, a decoupling capacitor may be formed in the first region to stabilize a power supply. An additional decoupling capacitor may be formed in the outer space of a cell region or between elements to stabilize a power supply.

A variable resistance element is formed on an upper portion of the substrate of a cell region as will be explained below.

FIGS. 4A to 4E are cross-sectional views showing a method for fabricating an electronic device shown in FIG. 3. Cross-sectional views of a cell region and a peripheral region are shown in FIGS. 4A to 4E. In FIGS. 4A to 4E, the cross-sectional view of the cell region shown includes cross-sectional views taken along a short-axis X-X', and a long-axis Y-Y'. The cross-sectional view of the peripheral region includes a cross-sectional view of a decoupling capacitor region.

As shown in FIG. 4A, an element isolation region 32 is formed in a substrate 31 including a first region and a second region. The substrate 31 may include a semiconductor substrate. The substrate 31 may include a silicon substrate, a silicon-germanium substrate, or a silicon-on-insulator (SOI) substrate. The first region and the second region may correspond to a cell region and the second region, respectively.

The element isolation region 32 includes a wall oxide, a liner and a gap-filling material. The liner may include a silicon nitride and a silicon oxide. The silicon nitride may include $Si_3N_4$, and the silicon oxide may include $SiO_2$. The gap-filling material may include a silicon oxide such as a spin-on-dielectric (SOD). The gap-filling material may include a silicon nitride. Herein, the gap-filling material may include the silicon nitride used in the liner.

A first active region 33A is defined by the element isolation region 32 of the first region. A second active region 33B is defined by an element isolation region (not shown) of the second region. The element isolation of the second region may have a line width wider and deeper than the element isolation region of the first region.

A first mask pattern 34 is formed on the substrate 31. The first mask pattern 34 may define a buried gate region in the first region and a trench region for a decoupling capacitor in the second region. The first mask pattern 34 may be patterned in a line type.

Figure 4B:
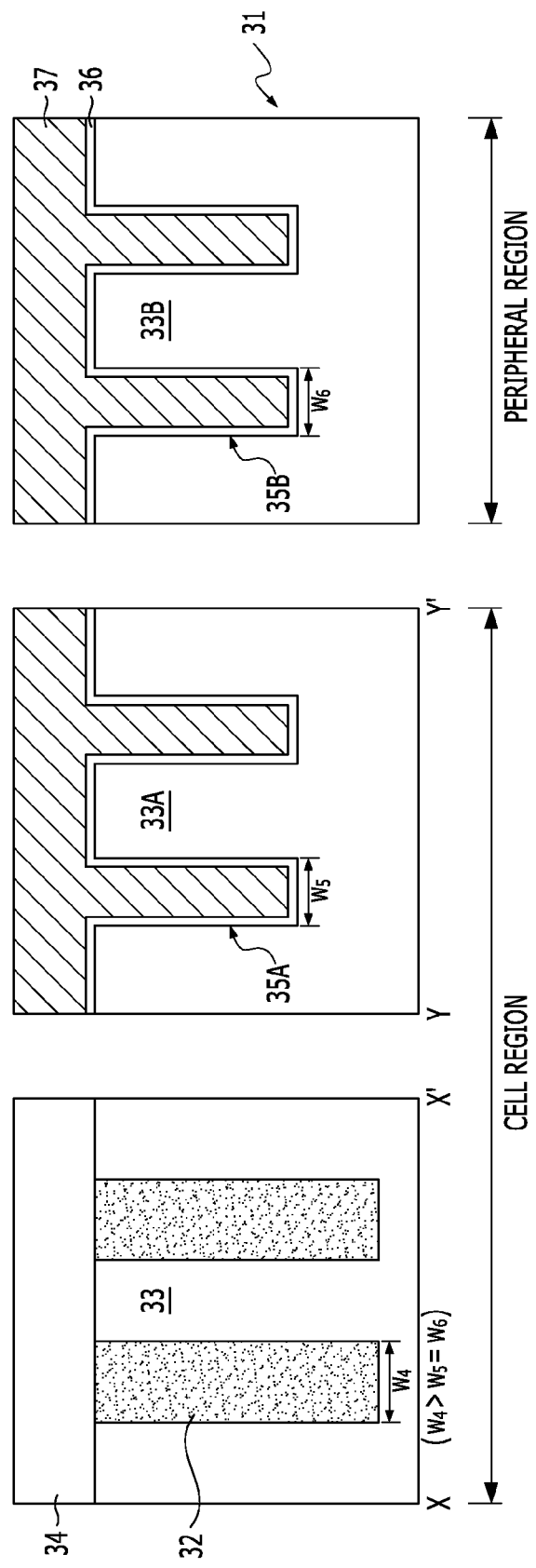

As shown in FIG. 4B, a first trench 35A and a second trench 35B are formed by etching the substrate 31 using the first mask pattern 34 as an etch barrier. The first trench 35A of the first region provides a buried gate region. The second trench 35B of the second region provides a decoupling capacitor region. The second trench 35B of the second region may have a line width $W_6$ as same as a line width $W_5$ of the first trench 35A of the first region. Herein, the line width $W_5$ of the first trench 35A and the line width $W_6$ of the second trench 35B of the second region may be narrower than a line width $W_4$ of the element isolation region.

Next, the first mask pattern is removed.

An insulation layer 36 is formed along an entire surface of the substrate 31 including the first trench 35A of the first region and the second trench 35B of the second region. In the first region, the insulation layer 36 may be used as a gate insulation layer between the substrate 31 and a buried gate which will be formed. In the second region, the insulation layer 36 may be used as a dielectric layer for the decoupling capacitor which will be formed. The insulation layer 36 may include a silicon oxide, a silicon nitride or a metal oxide having a high dielectric constant. The metal oxide may include a tantalum oxide, a hafnium oxide, an aluminum oxide, a zirconium oxide or a combination thereof. The insulation layer 36 may be formed through an oxide process, a chemical vapor deposition (CVD) process, a physical vapor deposition (PVD) process, or an atomic layer deposition (ALD) process.

A conducting material 37, which is buried in the first trench 35A of the first region and the second trench 35B of the second region, is formed on the insulation layer 36. The conducting material 37 may include a semiconductor layer or a metal-containing layer. The semiconductor layer may include a silicon layer. The silicon layer may include a polysilicon layer. The metal-containing layer may include a material having a main element such as a titanium (Ti), a tantalum (Ta), or a tungsten (W). The metal-containing layer may include a tantalum nitride (TaN), a titanium nitride (TiN), a tungsten nitride (WN) or a tungsten (W). For example, the conducting material 37 may include a titanium nitride (TiN), a tantalum nitride (TaN), a tungsten (W), or a stacked structure including TiN and W or including TaN and W, where the titanium nitride (TiN) or the tantalum nitride (TaN) is stacked on the tungsten (W). The conducting material 37 may include a stacked structure including WN and W where the tungsten nitride (WN) is stacked on the tungsten (W).

As shown in FIG. 4C, the conducting material 37 is etched so that the insulation layer 36 is exposed through a planarization process. The planarization process may include an etch back process or a chemical mechanical polishing (CMP) process.

A first buried conductive pattern 38 remains in the first trench 35A of the first region, and a second buried conductive pattern 39 remains in the second trench 35B of the second region.

As shown in FIG. 4D, a second mask pattern 40 is formed on the second buried conductive pattern 39 of the second region. When the first buried conductive pattern 38 of the first region is etched, the second mask pattern 40 protects the second buried conductive pattern 39 of the second region from being lost.

Subsequently, a buried gate electrode 38A, which is partially buried in the first trench 35A, is formed by recessing the first buried conductive pattern 38 of the first region. The buried gate electrode 38A may operate as a switching element of a semiconductor device for selecting a specific memory cell of a plurality of memory cells in the semiconductor device.

Figure 4E:
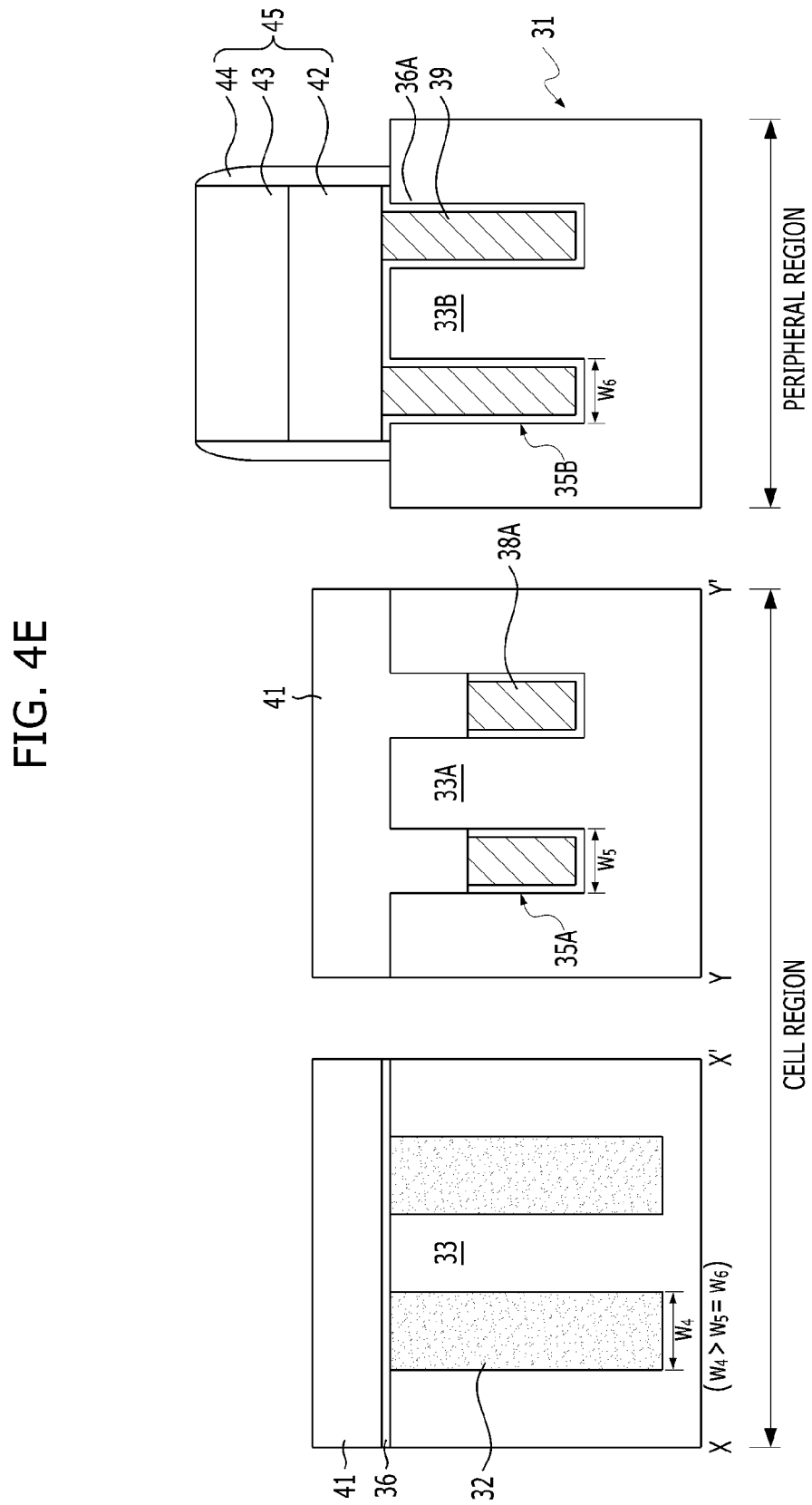

As shown in FIG. 4E, a sealing layer 41 is formed on the buried gate electrode 38A. The sealing layer 41 may gap-fill the first trench 35A on the buried gate electrode 38A. The sealing layer 41 may protect the buried gate electrode 38A during subsequent processes. The sealing layer 41 may include an insulating material. The sealing layer 41 may a silicon nitride. The sealing layer 41 may be planarized.

Subsequently, the second mask pattern 40 is removed. Alternatively, the second mask pattern 40 may be removed before the sealing layer 41 is formed.

A conductive pattern 45 is formed to be coupled to the second buried conductive pattern 39 in the second region. The conductive pattern 45 may include a stacked structure of a metal-containing layer 42 and a hard mask layer 43. The wall spacer 44 may be formed on the sidewall of the conductive pattern 45. The metal-containing layer 42 may include a stacked structure of a barrier metal layer and a metal layer. The metal-containing layer 42 may include the same material as the second buried conductive pattern 39. The hard mask layer 43 may be used as an etch barrier of the metal-containing layer 42 and may include an insulation material, e.g., a silicon nitride. The wall spacer 44 protects a side wall of the conductive pattern 45 and may include an insulation material. The conductive pattern 45 may be formed by stacking the metal-containing layer 42 and the hard mask layer 43 and patterning the second buried conductive pattern 39. Herein, the insulation layer 36A may be etched when the patterning is performed.

The conductive pattern 45 may be formed concurrently with a gate process of the second region except the decoupling capacitor region. The conductive pattern 45 is coupled to the second buried conductive pattern 39 to form a buried decoupling capacitor. The substrate 31 is used as a lower electrode of the buried decoupling capacitor, the insulation layer 36 is used as a dielectric layer of the buried decoupling capacitor, and the second buried conductive pattern 39 and the conductive pattern 45 are used as an upper electrode of the buried decoupling capacitor.

As described above, a separate or additional mask process is not performed for forming a decoupling capacitor. Rather, the mask process for forming a decoupling capacitor is performed at the same time by using the same mask used for forming a buried gate region of the first region. Since an additional etching process or a mask process may be omitted, a fabrication process may be simplified. Further, the productivity may be improved while obtaining an enough margin.

Furthermore, since more trenches can be formed in the same region, each trench has a same line width $W_6$ as a line width $W_5$ of the first trench 35A for the buried gate region of the first region, a capacitance of a capacitor may increase.

If a fine pattern process such as a spacer pattern technology (SPT) process or a double pattern technology (DPT) process is used in forming the first trench 35A for the buried gate region of the first region, trenches can be formed to have a line width sufficient to overcome exposure limitations. Thus, an area may be maximized and a capacitance of the capacitor may increase.

Although two second buried conductive patterns are formed in the second region in the present implementation, the number of second buried conductive patterns may increase or decrease. For example, a single decoupling capacitor may include a plurality of buried conductive patterns according to a required capacitance.

Although the decoupling capacitor is formed in the second region in the present implementation, the decoupling capacitor may be formed in a first region to stabilize a power supply. An additional decoupling capacitor may be formed between elements or in the outer space of the cell region to stabilize a power supply. Then, a variable resistance element may be formed on an upper portion of a substrate in a cell region as will be described later.

Figure 5:
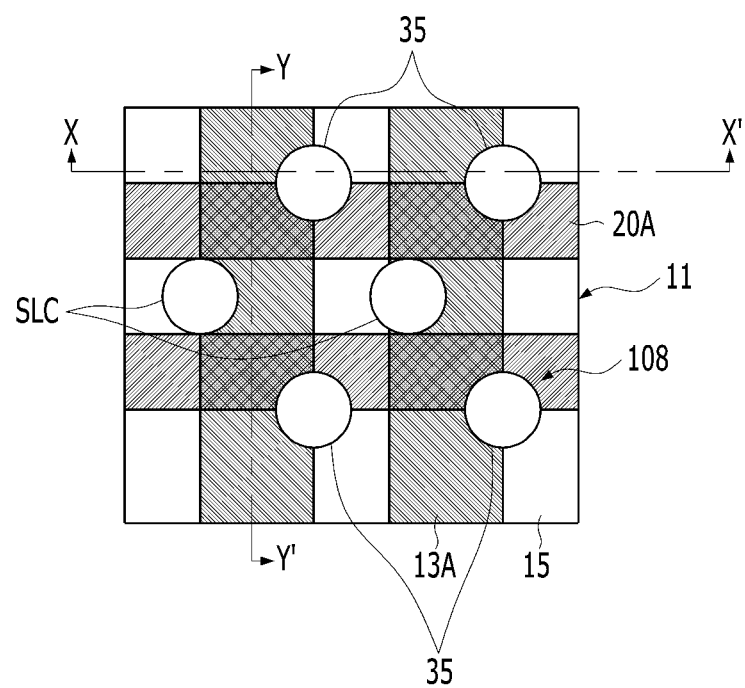
FIG. 5 is an exemplary cross-sectional view of an electronic device including a variable resistance element in accordance with an implementation of the disclosed technology in this patent document.

FIG. 5 is an exemplary cross-sectional view of an electronic device including a variable resistance element. FIG. 5 shows an exemplary plane view illustrating a semiconductor device including a variable resistance element, which is obtained after forming a buried gate and a decoupling capacitor. For the convenience of the descriptions, the same reference numerals as used in FIG. 1 and FIGS. 2A to 2H are used to indicate the same elements.

As shown in FIG. 5, an element isolation region 15 is formed in a semiconductor substrate 11, and an active region 13A of a line type may be formed in the semiconductor substrate 11. A switching element 20A may be formed in the active region 13A. Although the active region 13A has the line type in FIG. 5, an active region of an island type may be further formed in the semiconductor substrate 11. Further, although the switching element 20A has a buried gate in FIG. 5, the switching element 20A may include a recessed gate, a plane gate, or a vertical gate.

A variable resistance element 35 and a source line contact (SLC) may be formed over the active region 13A. The variable resistance element 35 may be arranged in a matrix shape. The variable resistance element 35 and the source line contact (SLC) may be repeatedly arranged to cross each other. The SLC may be arranged between a couple of switching elements 20A. The SLC may be arranged to have a predetermined interval from the variable resistance element 35.

FIGS. 6A to 6E are cross-sectional views showing a method for fabricating an electronic device shown in FIG. 5. FIGS. 6A to 6E are cross-sectional views taken along X-X' in FIG. 5. For the convenience of the descriptions, the same reference numerals as used in FIGS. 1, 2A to 2H and 5 are used to indicate the same elements.

Figure 6A:
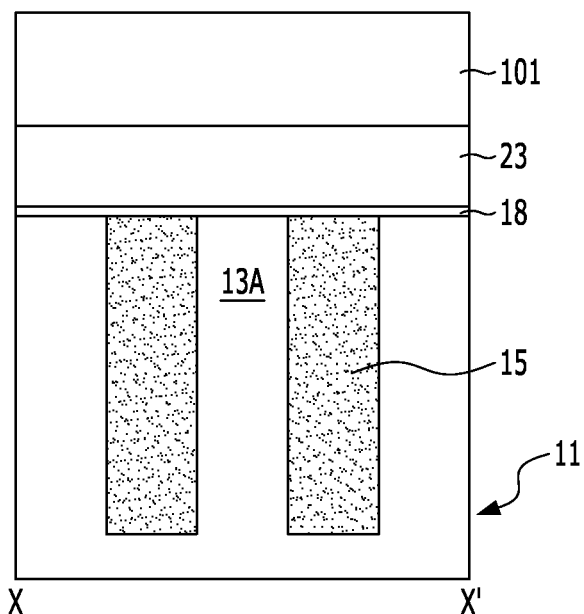
FIGS. 6A to 6E are cross-sectional views explaining a method for fabricating an electronic device shown in FIG. 5.

As shown in FIG. 6A, an element isolation region 15, a switching element (not shown) such as a buried gate electrode, and a decoupling capacitor (not shown) are formed in the substrate 11.

Herein, the switching element selects a specific memory cell among a plurality of memory cells of a semiconductor device, and may include a transistor or a diode. An end of the switching element may be electrically coupled to a first contact plug, and the other end of the switching element may be electrically coupled to a source line through a source line contact (SLC). The decoupling capacitor may be formed in the outer space of the cell region and between elements as well as in the peripheral region. The decoupling capacitor may include a structure where a buried conductive pattern is coupled to a conductive pattern protruding above an upper portion of a substrate.

An insulation layer 18 and a sealing layer 23 may be formed in the substrate 11.

Subsequently, a first interlayer insulation layer 101 may be formed on the sealing layer 23. The first interlayer insulation layer 101 may include a single layer or a stacked structure including an oxide layer, a nitride layer and an oxide nitride layer.

Figure 6B:
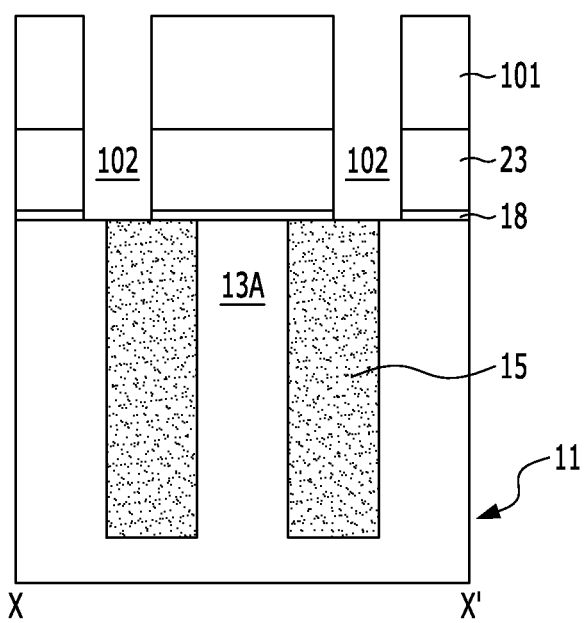

As shown in FIG. 6B, a first contact hole 102 is formed to expose the substrate 11 by penetrating the first interlayer insulation layer 101, the sealing layer 23 and the insulation layer 18.

Figure 6C:
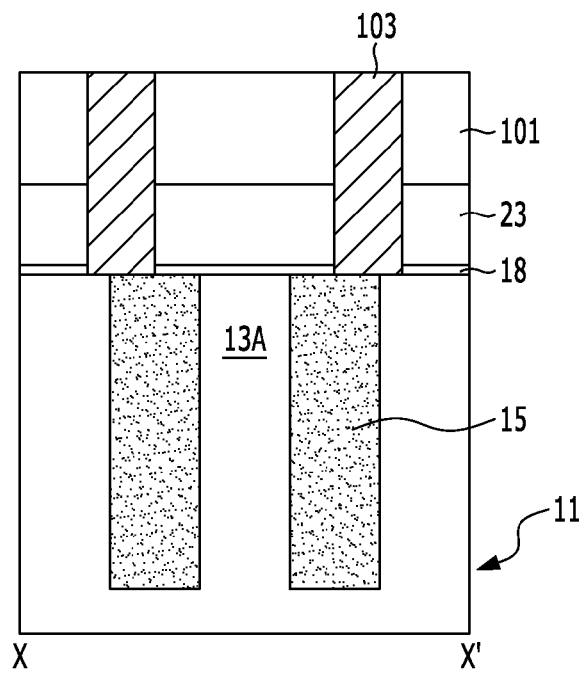

As shown in FIG. 6C, a first contact plug 103 is formed by gap-filling a conductive material in the first contact hole 102. The first contact plug 103 may be formed by an isolation process which includes forming a conductive material in the entire surface to gap-fill the first contact hole 102 and electrically isolating adjacent first contact holes 103. The isolation process may be performed by etching the conductive material formed on the entire surface until the first interlayer insulation layer 101 is exposed using an etch-back process or a chemical mechanical polishing process.

Figure 6D:
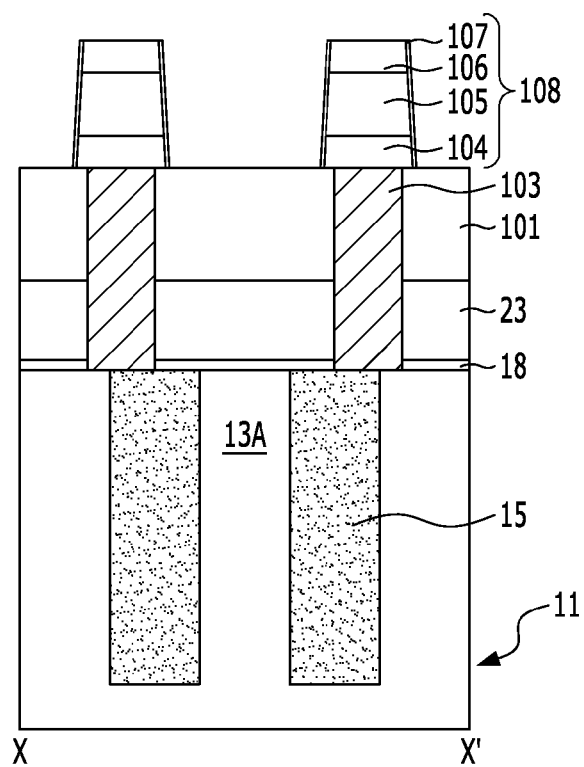

As shown in FIG. 6D, the variable resistance element 108 is formed on the first interlayer insulation layer 101 including the first contact plug 103. The variable resistance element 108 may include a stacked structure including a first electrode 104, a variable resistance layer 105 and a second electrode 106, and may further include a spacer 107 formed on side walls of the stacked structure. Herein, the variable resistance layer 105 may include a stacked structure including a first ferromagnetic layer (not shown), a second ferromagnetic layer (not shown) and a tunneling barrier layer (not shown) disposed therebetween. The variable resistance element 108 may further include a template layer, a coupling layer and an interface layer, thereby improving characteristics of each of ferromagnetic layers.

The variable resistance element 108 may have a characteristic switched between different resistance states according to a magnetization direction of the first and the second ferromagnetic layers. For example, if the magnetization direction of the first and the second ferromagnetic layers are same (or parallel), the variable resistance element 108 may have a low resistance state, and if the magnetization direction of the first and the second ferromagnetic layers are different (or anti-parallel), the variable resistance element 108 may have a high resistance state.

One of the first and the second ferromagnetic layers may be a pinned ferromagnetic layer. The other of the first and the second ferromagnetic layers may be a free ferromagnetic layer of which a magnetization direction is variable according to a direction of a current flowing on the variable resistance element 108. The first and the second ferromagnetic layers may be a single layer or multi-layers including a ferromagnetic material, e.g., Fe—Pt alloy, Fe—Pd alloy, Co—Pd alloy, Co—Pt alloy, Co—Fe alloy, Fe—Ni—Pt alloy, Co—Fe—Pt alloy, Co—Ni—Pt alloy. The first and the second ferromagnetic layers may further include impurities such as boron (B). Other implementations are also possible.

The tunneling barrier layer allows a tunneling of an electron and variations of a magnetization direction of the free ferromagnetic layer. The tunneling barrier layer may include a single layer or multi-layers including a dielectric material, e.g., an oxide such as $Al_2O_3$, MgO, CaO, SrO, TiO, VO, or NbO.

The first electrode 104 and the second electrode 106 may include a metal layer. The metal layer includes a conductive layer including a metal material such as a metal layer, a metal oxide layer, a metal nitride layer, a metal oxide nitride layer, or a metal silicide layer.

The first electrode 104 may be a bottom electrode of the variable resistance element 108. The second electrode 106 may be a top electrode of the variable resistance element 108 and used as an etch barrier for patterning lower layers of the variable resistance element 108. The first contact plug 103 coupled to the first electrode 104 may be used as a bottom electrode contact (BEC).

Figure 6E:
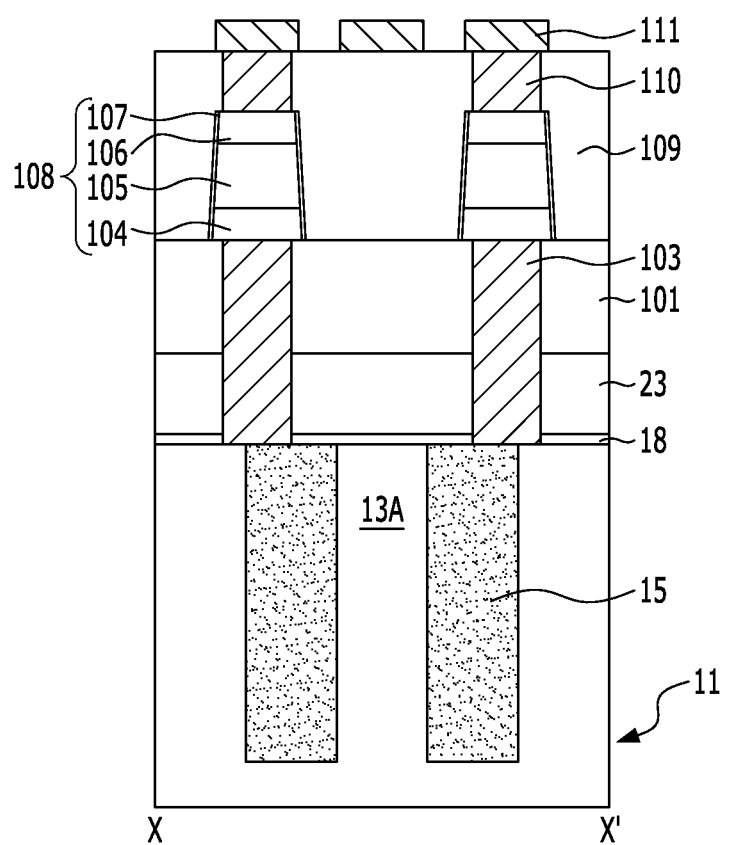

As shown in FIG. 6E, a second interlayer insulation layer 109 is formed on the first interlayer insulation layer 101. The second interlayer insulation layer 109 may have a sufficient thickness to cover variable resistance elements 108. For example, the second interlayer insulation layer 109 may have a height the same as or greater than the variable resistance element 108. The second interlayer insulation layer 109 may include the same material as the first interlayer insulation layer 101. The second interlayer insulation layer 109 may include a single layer or multi-layers including an oxide layer, a nitride layer or an oxide nitride layer.

Subsequently, a second contact plug 110 is formed to be coupled to the variable resistance element 108 by penetrating an upper portion of the second interlayer insulation layer 109. After a contact hole is formed by etching the second interlayer insulation layer 109 such that an upper portion of the variable resistance element 108 is exposed, the second contact plug 110 may be formed by burying a conductive material in the contact hole. The second contact plug 110 may electrically couple a conductive line 111 to the variable resistance element 108 and may be used as a top electrode contact (TEC) of the variable resistance element 108. The second contact plug 110 may include the same material as the first contact plug 103.

A third contact plug (not shown) may be formed to couple the conductive line 111 to the switching element. As shown in FIG. 5, the third contact plug may be arranged to have a predetermined interval from the variable resistance element 108.

Subsequently, the conductive line 111 is formed on the second interlayer insulation layer 109. The conductive line 111 may include a metal layer. The metal layer includes a conductive layer including a metal material, and may include a metal oxide, a metal nitride, a metal oxide nitride, or a metal silicide layer. The conductive line 111 may operate as a bit line or a source line depending on the portion to be connected.

In the present implementation, a decoupling capacitor is provided between variable resistance elements, in the outer space of the cell region, or in the peripheral region, thereby stabilizing a power supply. Further, the decoupling capacitor has the same line width as that of the switching element or the element isolation region, thereby simplifying a mask process and improving the productivity. A capacitance of a capacitor may increase by forming a plurality of buried conductive patterns each having a narrow line width.

The above and other memory circuits or semiconductor devices based on the disclosed technology can be used in a range of devices or systems. FIGS. 7-11 provide some examples of devices or systems that can implement the memory circuits disclosed herein.

Figure 7:
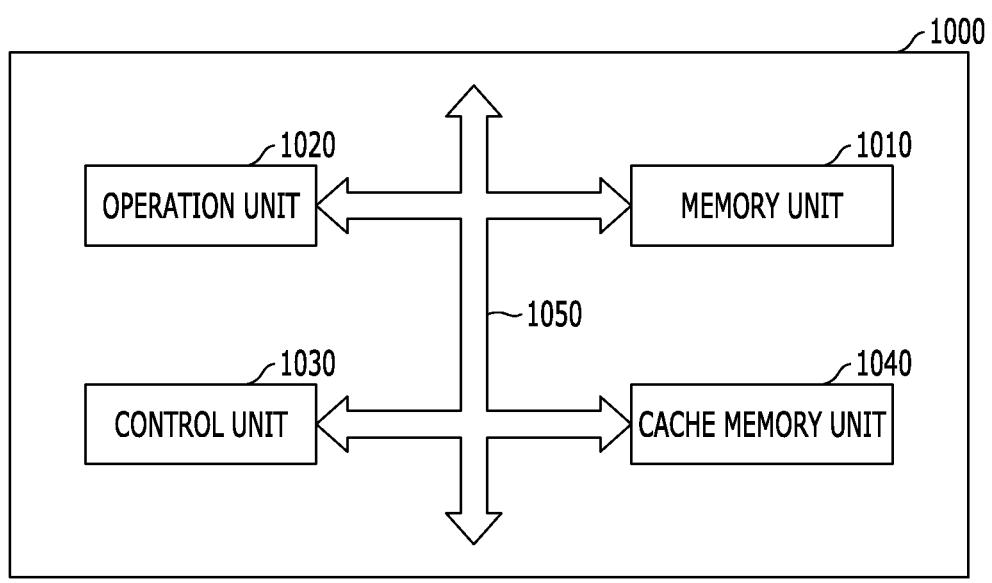
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020 and a control unit 1030. The microprocessor 1000 may be various types of processing units such as a central processing unit (CPU), a graphic processing unit (GPU), a digital signal processor (DSP) and an application processor (AP).

The memory unit 1010 is a part which stores data in the microprocessor 1000, as a processor register, a register, or the like. The memory unit 1010 may include a data register, an address register and a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, The memory unit 1010 may include a substrate including a switching element having a buried gate electrode, a buried decoupling capacitor having a line width same as a line width of the buried gate electrode, and a variable resistance element, electrically coupled to the switching element, formed over the substrate. Through this, a fabrication process of the memory unit 1010 may become easy and the reliability of the memory unit 1010 may be improved. As a consequence, a fabrication process of the microprocessor 1000 may become easy and the reliability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
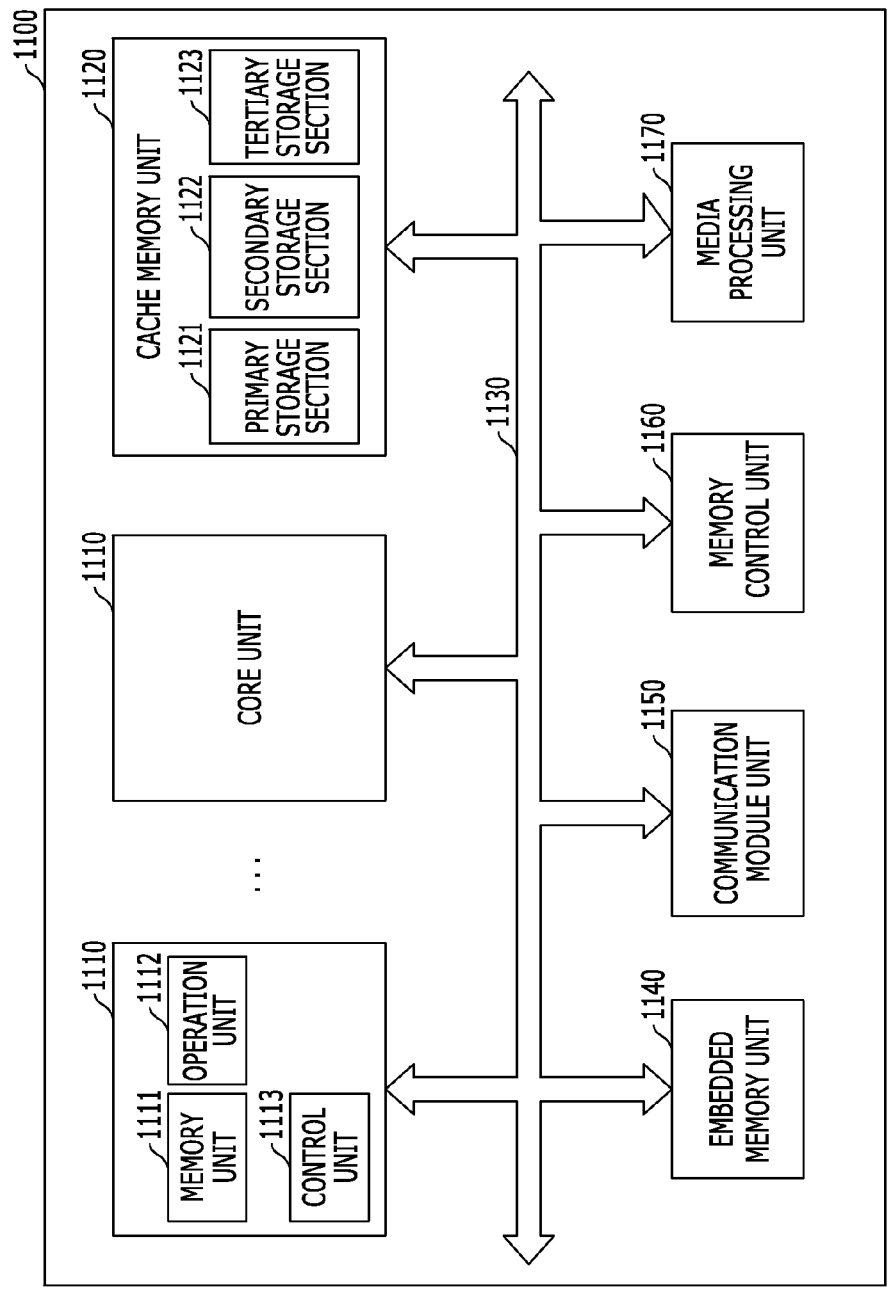
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the memory unit 1010 may include a substrate including a switching element having a buried gate electrode, a buried decoupling capacitor having a line width same as a line width of the buried gate electrode, and a variable resistance element, electrically coupled to the switching element, formed over the substrate. Through this, a fabrication process of the cache memory unit 1120 may become easy and the reliability of the cache memory unit 1120 may be improved. As a consequence, a fabrication process of the processor 1100 may become easy and the reliability of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
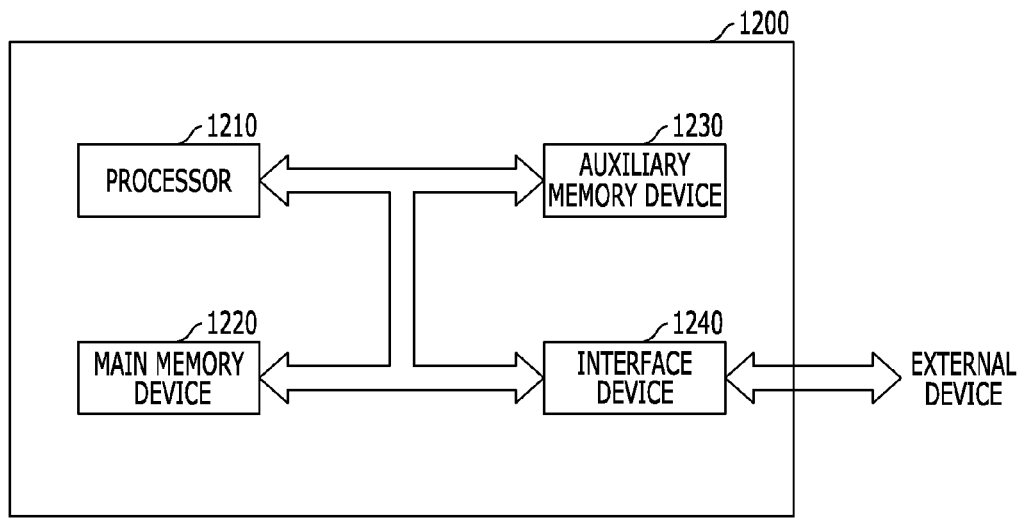
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate including a switching element having a buried gate electrode, a buried decoupling capacitor having a line width same as a line width of the buried gate electrode, and a variable resistance element, electrically coupled to the switching element, formed over the substrate. Through this, a fabrication process of the main memory device 1220 may become easy and the reliability of the main memory device 1220 may be improved. As a consequence, a fabrication process of the system 1200 may become easy and the reliability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate including a switching element having a buried gate electrode, a buried decoupling capacitor having a line width same as a line width of the buried gate electrode, and a variable resistance element, electrically coupled to the switching element, formed over the substrate. Through this, a fabrication process of the auxiliary memory device 1230 may become easy and the reliability of the auxiliary memory device 1230 may be improved. As a consequence, a fabrication process of the system 1200 may become easy and the reliability of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device

1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
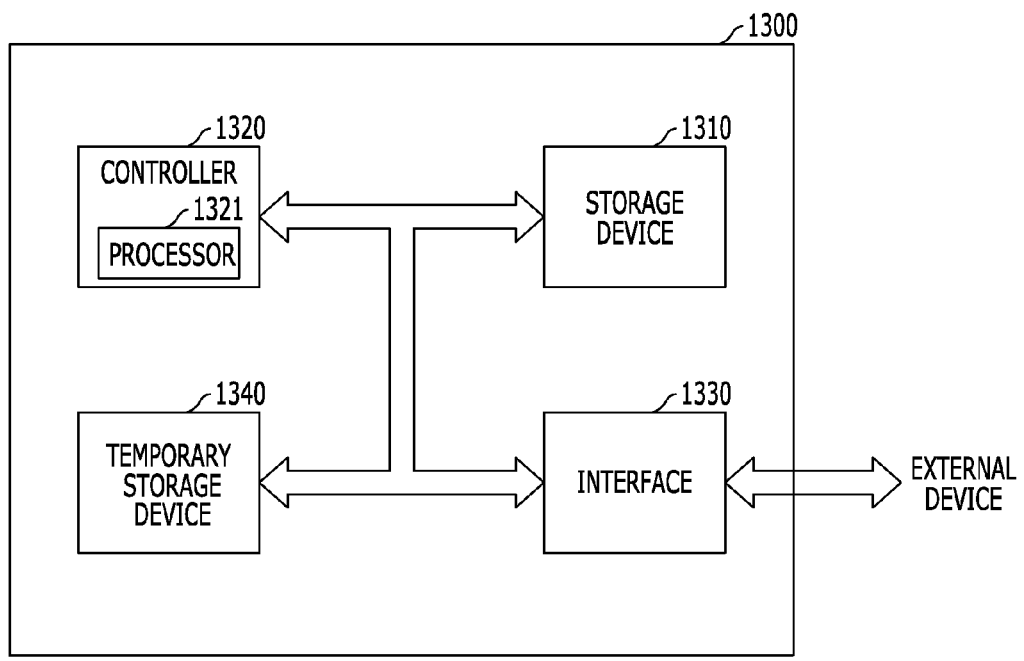
FIG. 10 is an example of configuration diagram of a data storage system implementing memory circuitry based on the disclosed technology.

FIG. 10 is an example of configuration diagram of a data storage system implementing memory circuitry based on the disclosed technology. Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 may store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The storage device 1310 or the temporary storage device 1340 may include a substrate including a switching element having a buried gate electrode, a buried decoupling capacitor having a line width same as a line width of the buried gate electrode, and a variable resistance element, electrically coupled to the switching element, formed over the substrate. Through this, a fabrication process of the storage device 1310 or the temporary storage device 1340 may become easy and the reliability of the storage device 1310 or the temporary storage device 1340 may be improved. As a consequence, a fabrication process of the data storage system 1300 may become easy and the reliability of the data storage system 1300 may be improved.

Figure 11:
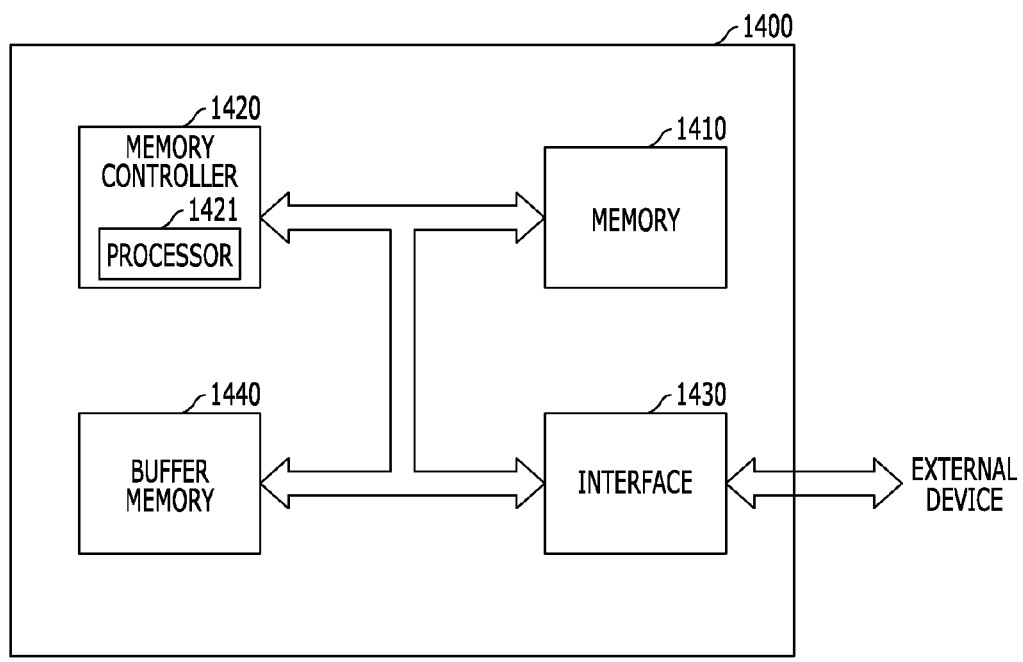
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate including a switching element having a buried gate electrode, a buried decoupling capacitor having a line width same as a line width of the buried gate electrode, and a variable resistance element, electrically coupled to the switching element, formed over the substrate. Through this, a fabrication process of the memory 1410 may become easy and the reliability of the memory 1410 may be improved. As a consequence, a fabrication process of the memory system 1400 may become easy and the reliability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element which includes a free magnetic layer, a tunnel barrier layer and a pinned magnetic layer, and a magnetic correction layer which is disposed over the variable resistance element to be separated from the variable resistance element and has a magnetization direction opposite to a magnetization direction of the pinned magnetic layer. Through this, a fabrication process of the buffer memory 1440 may become easy and the reliability of the buffer memory 1440 may be improved. As a consequence, a fabrication process of the memory system 1400 may become easy and the reliability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a variable resistance element is easy, and it is possible to secure the characteristics of the variable resistance element.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that includes:
    a substrate including a switching element having a buried gate electrode; a buried decoupling capacitor having a line width same as a line width of the buried gate electrode;
    a variable resistance element electrically coupled to the switching element and formed over the substrate; and
    wherein the buried gate electrode and the buried decoupling capacitor are formed on a same horizontal plane.

2. The electronic device according to claim 1, wherein the substrate includes a cell region and a peripheral region, and the buried decoupling capacitor is formed on the peripheral region.

3. The electronic device according to claim 1, wherein the buried decoupling capacitor is formed in an outer region of the substrate.

4. The electronic device according to claim 1, wherein the buried decoupling capacitor includes a buried conductive pattern, which includes a portion buried in the substrate, and another portion that protrudes above an upper portion of the substrate.

5. The electronic device according to claim 1, wherein the buried decoupling capacitor is coupled to a plurality of buried conductive patterns, which are buried in the substrate, and includes a conductive pattern, which protrudes above an upper portion of the substrate.

6. The electronic device according to claim 1, wherein the semiconductor memory unit further comprising:
    an insulation layer disposed between the substrate and the buried decoupling capacitor.

7. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

8. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance element is part of the auxiliary memory device or the main memory device in the processing system.

9. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

10. An electronic device comprising a semiconductor memory unit that includes:

a substrate including an element isolation region defining an active region of the substrate and a switching element; and a decoupling capacitor, including a capacitor electrode that includes an electrode portion buried in the substrate and, having a line width which is the same as a line width of the element isolation region, wherein the decoupling capacitor is coupled to stabilize a power supply for the electronic device.

11. The electronic device according to claim 10, wherein the substrate includes a cell region and a peripheral region, and the decoupling capacitor is formed in the peripheral region.

12. The electronic device according to claim 10, wherein the decoupling capacitor is formed in an outer region of the substrate.

13. The electronic device according to claim 10, wherein the decoupling capacitor includes a buried conductive pattern, which is buried in the substrate, and a conductive pattern, which protrudes above an upper portion of the substrate.

14. The electronic device according to claim 10, wherein the decoupling capacitor is coupled to a plurality of buried conductive patterns, which are buried in the substrate, and a conductive pattern, which protrudes above an upper portion of the substrate.

15. The electronic device according to claim 10, wherein the semiconductor memory unit further comprises an insulation layer disposed between the substrate and the decoupling capacitor.

16. An electronic device comprising a semiconductor memory unit that includes:

a substrate including active regions defined by an element isolation region having a line width $W_1$;

a buried gate electrode that is buried in the substrate and is operable as a switching element and has a line width $W_2$ different from $W_1$;

a buried decoupling capacitor including (1) a buried conductive pattern that includes a portion buried in the substrate and has a line width $W_3$ which is the same as the line with $W_1$ or the line width $W_2$ and (2) a conductive pattern coupled to the buried conductive pattern, the decoupling capacitor being coupled and operable to stabilize a power supply for the electronic device; and a variable resistance element electrically coupled to the switching element and formed over the substrate.

17. The electronic device according to claim 16, wherein the substrate includes a cell region and a peripheral region, and the buried decoupling capacitor is formed on the peripheral region.

18. The electronic device according to claim 16, wherein the buried decoupling capacitor is formed in an outer region of the substrate.

19. The electronic device according to claim 16, wherein the buried conductive pattern is buried in the substrate, and the conductive pattern protrudes above the substrate.

20. The electronic device according to claim 16, wherein the semiconductor memory unit further comprising:

an insulation layer disposed between the substrate and the buried decoupling capacitor.

* * * * *